US010861872B2

United States Patent
Hua et al.

(10) Patent No.: US 10,861,872 B2
(45) Date of Patent: Dec. 8, 2020

(54) THREE-DIMENSIONAL MEMORY DEVICE AND METHOD FOR FORMING THE SAME

(71) Applicant: YANGTZE MEMORY TECHNOLOGIES CO., LTD., Wuhan (CN)

(72) Inventors: Wenyu Hua, Wuhan (CN); Fandong Liu, Wuhan (CN); Zhiliang Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/402,202

(22) Filed: May 2, 2019

(65) Prior Publication Data

US 2020/0273873 A1 Aug. 27, 2020

Related U.S. Application Data

(63) Continuation of application No. PCT/CN2019/076186, filed on Feb. 26, 2019.

(51) Int. Cl.
*H01L 27/11582* (2017.01)
*H01L 23/535* (2006.01)
*H01L 29/08* (2006.01)
*H01L 29/10* (2006.01)

(52) U.S. Cl.
CPC ...... *H01L 27/11582* (2013.01); *H01L 23/535* (2013.01); *H01L 29/0847* (2013.01); *H01L 29/1037* (2013.01)

(58) Field of Classification Search
CPC ............ H01L 27/11582; H01L 23/535; H01L 29/0847; H01L 29/1037
See application file for complete search history.

(56) References Cited

U.S. PATENT DOCUMENTS 8,822,285 B2    9/2014  Hwang et al.
2019/0043883 A1 2/2019  Xu et al.

FOREIGN PATENT DOCUMENTS

| CN | 104157654 A | 11/2014 |
| CN | 106057813 A | 10/2016 |
| CN | 108695336 A | 10/2018 |
| CN | 108886040 A | 11/2018 |
| CN | 108962910 A | 12/2018 |
| CN | 109103199 A | 12/2018 |

(Continued)

OTHER PUBLICATIONS

International Search Report issued in corresponding International Application No. PCT/CN2019/076186, dated Oct. 23, 2019, 4 pages.

(Continued)

*Primary Examiner* — Syed I Gheyas
(74) *Attorney, Agent, or Firm* — Bayes PLLC

(57) ABSTRACT

Three-dimensional (3D) memory devices and methods for forming the 3D memory devices are provided. In one example, a 3D memory device includes a substrate, a memory stack including interleaved conductive layers and dielectric layers on the substrate, and a staircase structure on one side of the memory stack. The 3D memory device also includes a staircase contact in the staircase structure and a plurality of dummy source structures each extending vertically through the staircase structure. The plurality of dummy source structures surround the staircase contact.

20 Claims, 13 Drawing Sheets

(56) References Cited

FOREIGN PATENT DOCUMENTS

| TW | 201533887 | A | 9/2015 |
| TW | 201539724 | A | 10/2015 |
| TW | I569405 | A | 10/2016 |
| TW | 201834207 | A | 9/2018 |
| WO | 2018071143 | A2 | 4/2018 |

OTHER PUBLICATIONS

Written Opinion of the International Searching Authority issued in corresponding International Application No. PCT/CN2019/076186, dated Oct. 23, 2019, 5 pages.

US 10,861,872 B2

THREE-DIMENSIONAL MEMORY DEVICE AND METHOD FOR FORMING THE SAME

CROSS REFERENCE TO RELATED APPLICATION

This application is continuation of International Application No. PCT/CN2019/076186, filed on Feb. 26, 2019, entitled "THREE-DIMENSIONAL MEMORY DEVICE AND METHOD FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device is provided. The 3D memory device includes a substrate, a memory stack including interleaved conductive layers and dielectric layers on the substrate, and a staircase structure on one side of the memory stack. The 3D memory device also includes a staircase contact in the staircase structure. The 3D memory device further includes a plurality of dummy source structures each extending vertically through the staircase structure. The plurality of dummy source structures surround the staircase contact.

In another example, a 3D memory device is provided. The 3D memory device includes a substrate, a memory stack including interleaved conductive layers and dielectric layers on the substrate, and a staircase structure on one side of the memory stack. The 3D memory device also includes an array of dummy channel structures each extending vertically through the staircase structure. The 3D memory device further includes a plurality of dummy source structures each extending vertically through the staircase stack. A subset of the dummy channel structures is surrounded by the plurality of dummy source structures.

In a further example, a method for forming a 3D memory device is provided. The method includes forming a dielectric stack including interleaved sacrificial layers and dielectric layers on a substrate. The method also includes forming a staircase structure on at least one side of the dielectric stack. The method further includes forming a plurality of dummy channel holes and a plurality of dummy source holes extending vertically through the staircase structure. A subset of the dummy channel holes is surrounded by the plurality of dummy source holes. The method also includes forming a dummy channel structure in each of the plurality of dummy channel holes and forming interleaved conductive layers and dielectric layers in the staircase structure by replacing, through the dummy source holes, the sacrificial layers in the staircase structure with the conductive layers. In addition, the method includes forming a spacer along a sidewall of each of the plurality of dummy source holes to cover the conductive layers in the staircase structure and forming a contact within the spacer in each of the plurality of dummy source holes.

In yet another example, a method for forming a 3D memory device is provided. The method includes alternatingly depositing interleaved sacrificial layers and dielectric layers on a substrate. The method also includes forming a staircase structure on at least one side of the interleaved sacrificial layers and dielectric layers. The method also includes simultaneously etching through the staircase structure to form a plurality of dummy channel holes and a plurality of dummy source holes. The plurality of dummy source holes are aligned with a portion of the plurality of dummy channel holes in a row along a lateral direction in a plan view. The method also includes depositing a sealing layer in each of the plurality of dummy source holes and each of the plurality of dummy channel holes. The method also includes etching away the sealing layer in each of the dummy source holes. In addition, the method includes replacing, through the dummy source holes, the sacrificial layers in the staircase structure with a plurality of conductive layers and depositing a spacer along a sidewall of each of the dummy source holes.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
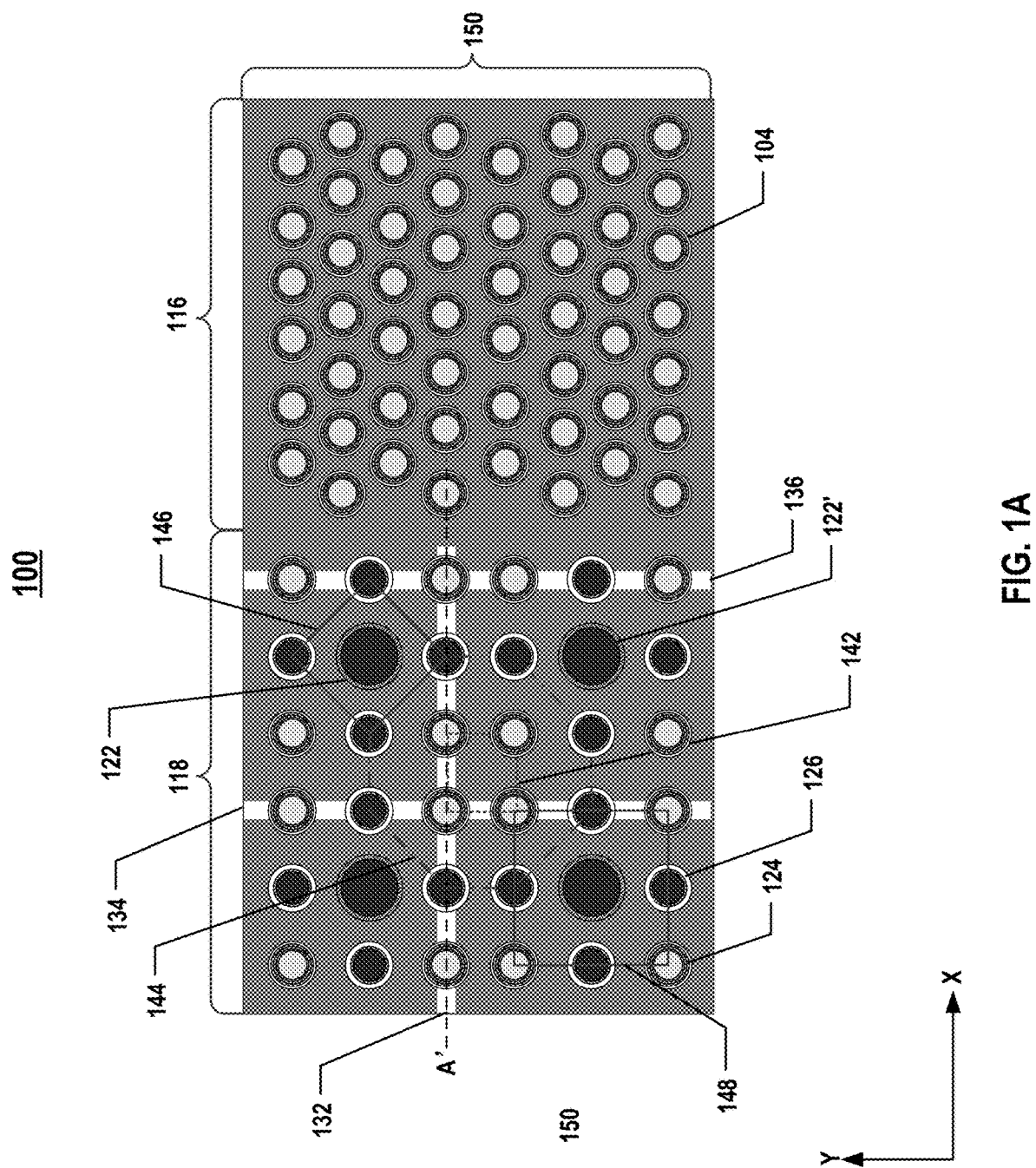
FIGS. 1A-1C illustrate plan views of exemplary 3D memory devices, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In 3D memory fabrication processes, a gate-replacement process is often used to form interleaved word line/dielectric stacks, in which sacrificial layers are replaced with conductive layers to form gate electrodes/word lines. Dummy channel structures (e.g., formed by filling dummy channel holes with dielectric materials) can be used in staircase structures of a 3D memory device to prevent oxide layer bending. As 3D memory devices continue to scale down, the gate-replacement process can become more challenging. For example, in some 3D memory devices such as charge trap 3D NAND memory devices, gate line slits (GLSs) are formed to divide an array of memory strings (e.g., in the inner region of a 3D memory device) and/or dummy channel structures (e.g., in the staircase region of the 3D memory device) into different memory regions. Often, a GLS has large dimensions and is filled with an insulation structure formed in a trench that extends laterally in the array. The gate-replacement process in such a 3D memory device often includes etching away the sacrificial layers and depositing a conductive material through the trench. Using GLSs to perform the gate-replacement process has drawbacks. For example, in the staircase region, the large lateral distance between adjacent GLSs can cause conductive material to be unevenly filled in the lateral recesses formed after the removal of the sacrificial layers, resulting in voids in the formed gate electrodes. The gate electrode may have an undesirably high resistance. Also, because dummy channel holes are formed between adjacent GLSs, the boundary conditions for the etching of dummy channel holes at different locations can be different due to the existence of large-area GLSs, causing dummy channel holes to have nonuniform lateral dimensions. For example, the lateral dimensions of a dummy channel hole may gradually vary as the dummy channel hole moves farther away from the GLSs, causing potential performance variation of the memory cells. In addition, the large areas occupied by the GLSs limit the usable space on the wafer surface to place other components, such as staircase contacts.

Figure 5:
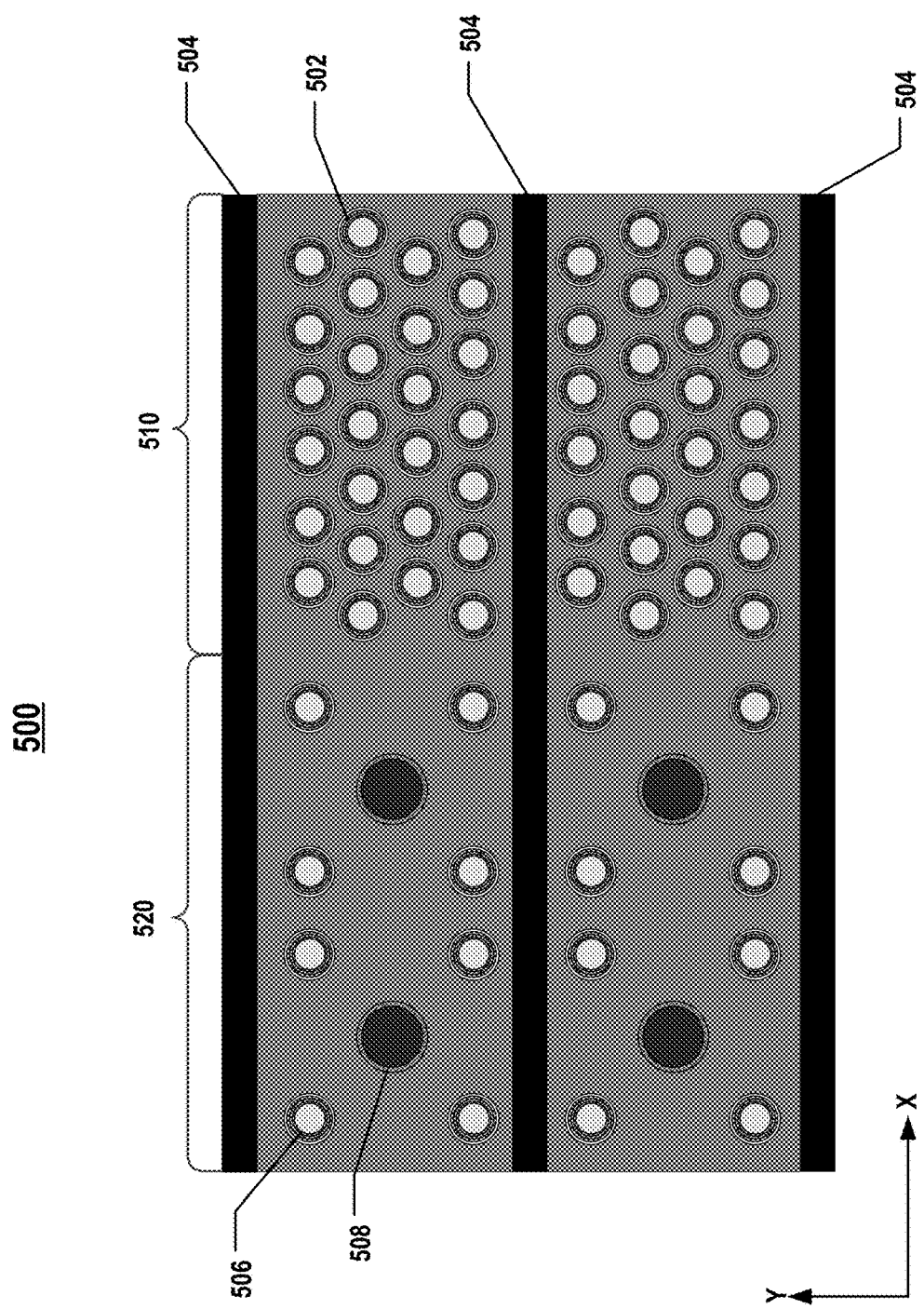
FIG. 5 illustrates a plan view of an exemplary 3D memory device having gate line slits.

For example, FIG. 5 illustrates a plan view of an exemplary 3D memory device 500 having GLSs 504. 3D memory device 500 includes an array of NAND memory strings 502 in an inner region 510, an array of dummy channel structures 506 in a staircase region 520, and multiple parallel GLSs 504, which divide arrays of NAND memory strings 502 and dummy channel structures 506 into different memory regions (e.g., memory fingers or blocks). As shown in FIG. 5, each GLS 504 extends laterally along the word line direction in a straight-line pattern in the plan view (parallel to the wafer plane). It is noted that x and y axes are included in FIG. 5 to illustrate two orthogonal directions in the wafer plane. The x-direction is the word line direction, and the y-direction is the bit line direction. 3D memory device 500 also includes staircase contacts 508 for forming word line contacts in the staircase structure.

During the gate replacement processes, conductive materials for forming the gate electrodes need to travel a relatively long distance between adjacent GLSs 504 to fill in the lateral recesses formed after the removal of sacrificial layers. This deposition process can be susceptible to formation of voids and/or nonuniformly deposited gate electrodes. Further, the shape of GLS 504 (e.g., having a slit shape with a dimension along the extending direction (or the x-direction) much greater than the dimension along the expanding dimension (or the y-direction)) can contribute to unbalanced variations of wafer flatness (e.g., wafer warpage bias) in different directions. The warpage bias can have an adverse impact on the photolithography process to form device patterns, leading to potential die yield loss.

Various embodiments in accordance with the present disclosure provide an improved 3D memory structure scheme suitable for solving the aforementioned issues by replacing the GLSs with dummy source structures. The 3D memory structure includes a plurality of dummy source structures distributed in the array of dummy channel structures and/or staircase contacts in the staircase region. Each dummy source structure may include an insulating spacer layer in a dummy source hole and a conductive contact within the spacer layer. In some embodiments, one or more dummy source structures are in contact with the substrate and may provide interconnect between the 3D memory device and peripheral devices. The dummy source structures may be arranged in a pattern, e.g., an array, so the dummy source structures can be uniformly distributed in the staircase structure. The arrangement of the dummy source structures may improve the uniformity and stability for etching dummy channel holes in the staircase region.

Also, the arrangement of the dummy source structures may allow the gate electrodes/word lines to be formed with improved uniformity and quality, reducing the resistivity of the gate electrodes/word lines. For example, the gate-replacement process can be performed to deposit a conductive material through the dummy source holes that subsequently form the dummy source structures. Because the conductive material travels shorter distances to fill up the lateral recesses for forming the gate electrodes, the gate electrodes are less susceptible to voids or density nonuniformity.

In the present disclosure, the dummy source holes, which can have the same diameter as the dummy channel holes, can be formed by the same process that forms the dummy channel holes, so the formation of the dummy source holes has minimal impact on the lateral uniformity of dummy channel holes. Further, both the dummy channel holes and the dummy source holes in the staircase region can be formed by the same process that forms the channel holes in the inner region. The etching process to form the channel holes may further result in channel holes with more uniform diameters. Meanwhile, the number of dummy channel holes formed in the staircase region can be flexibly determined, e.g., based on design and/or fabrication requirements.

Figure 1B:
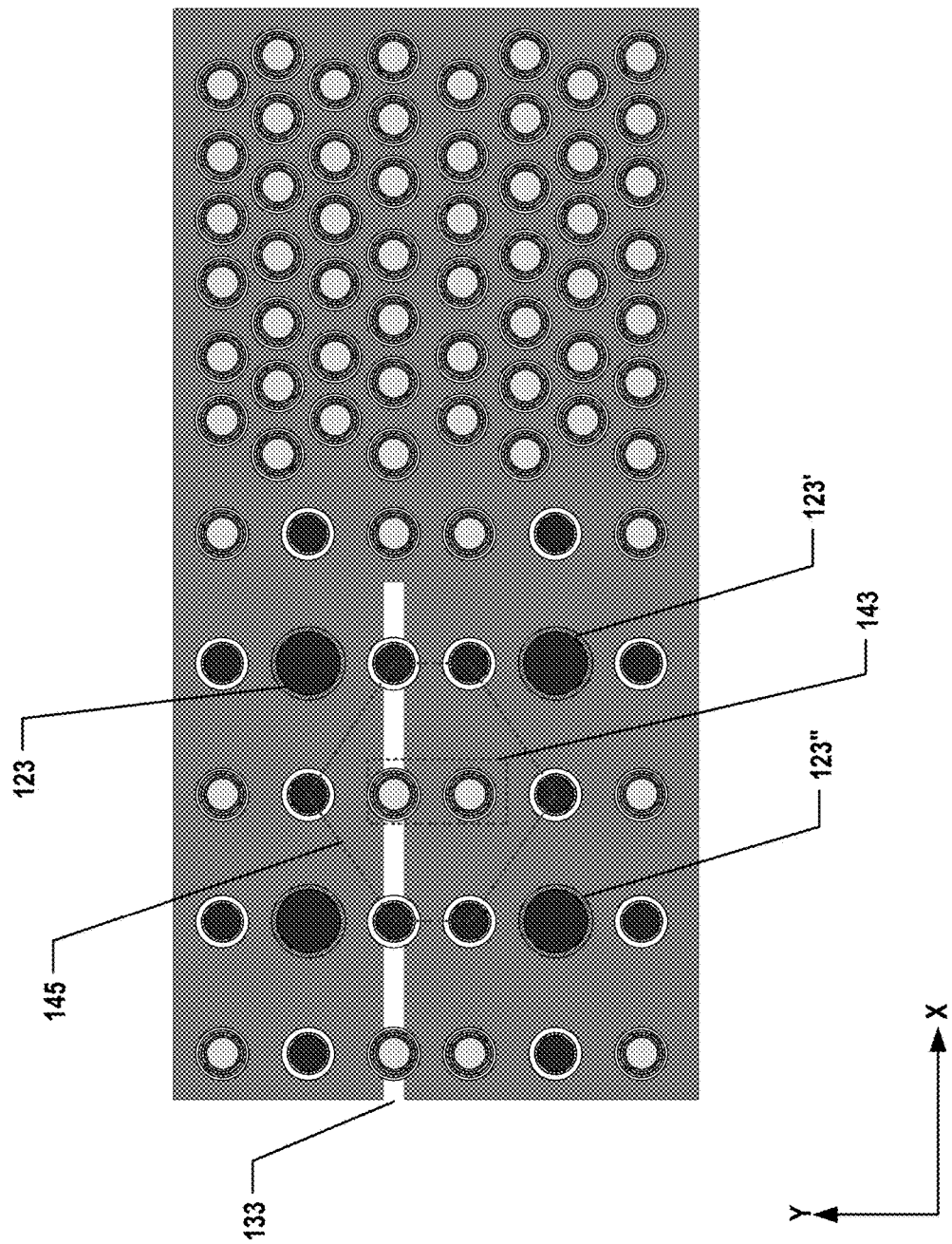
Figure 1C:
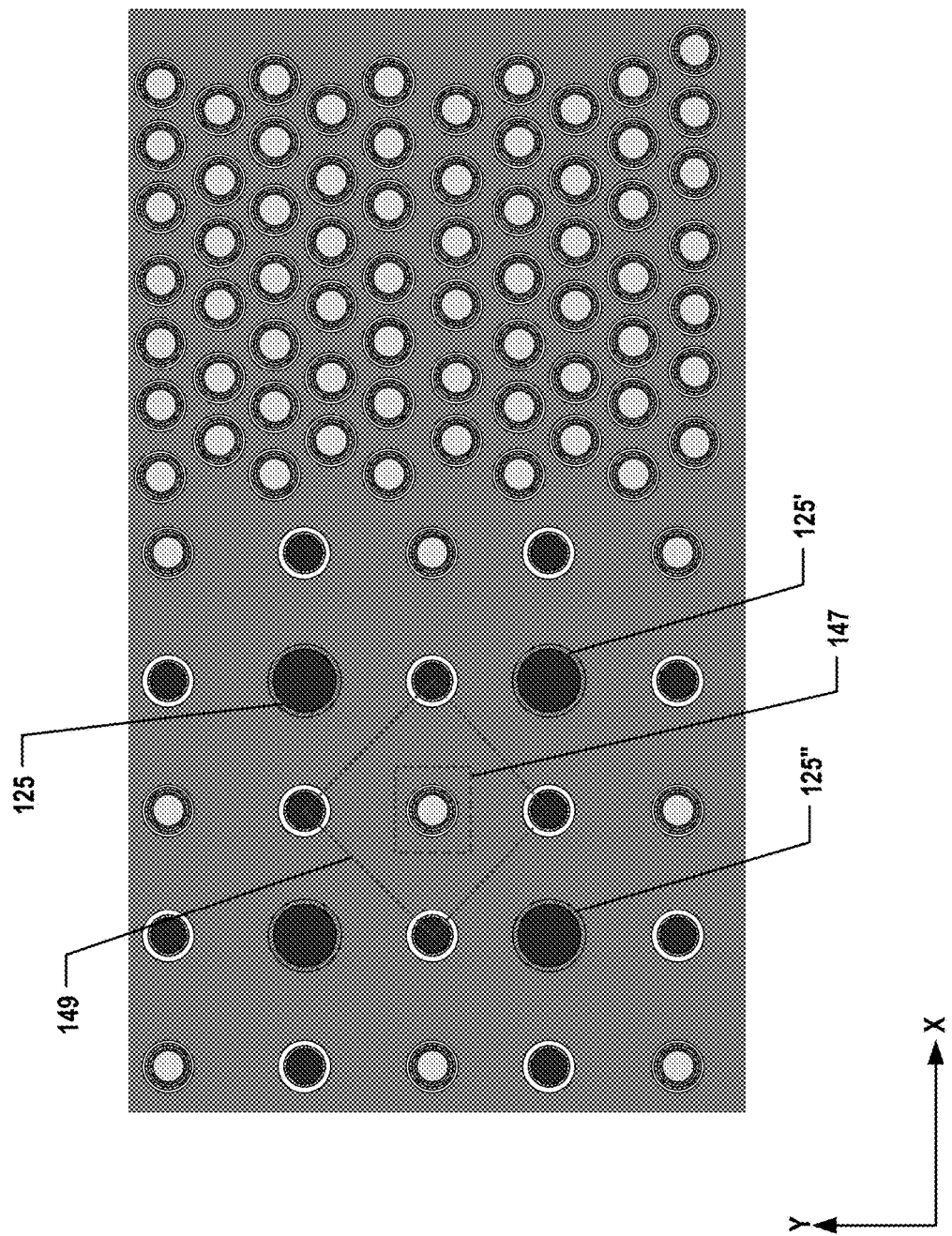
Figure 1D:
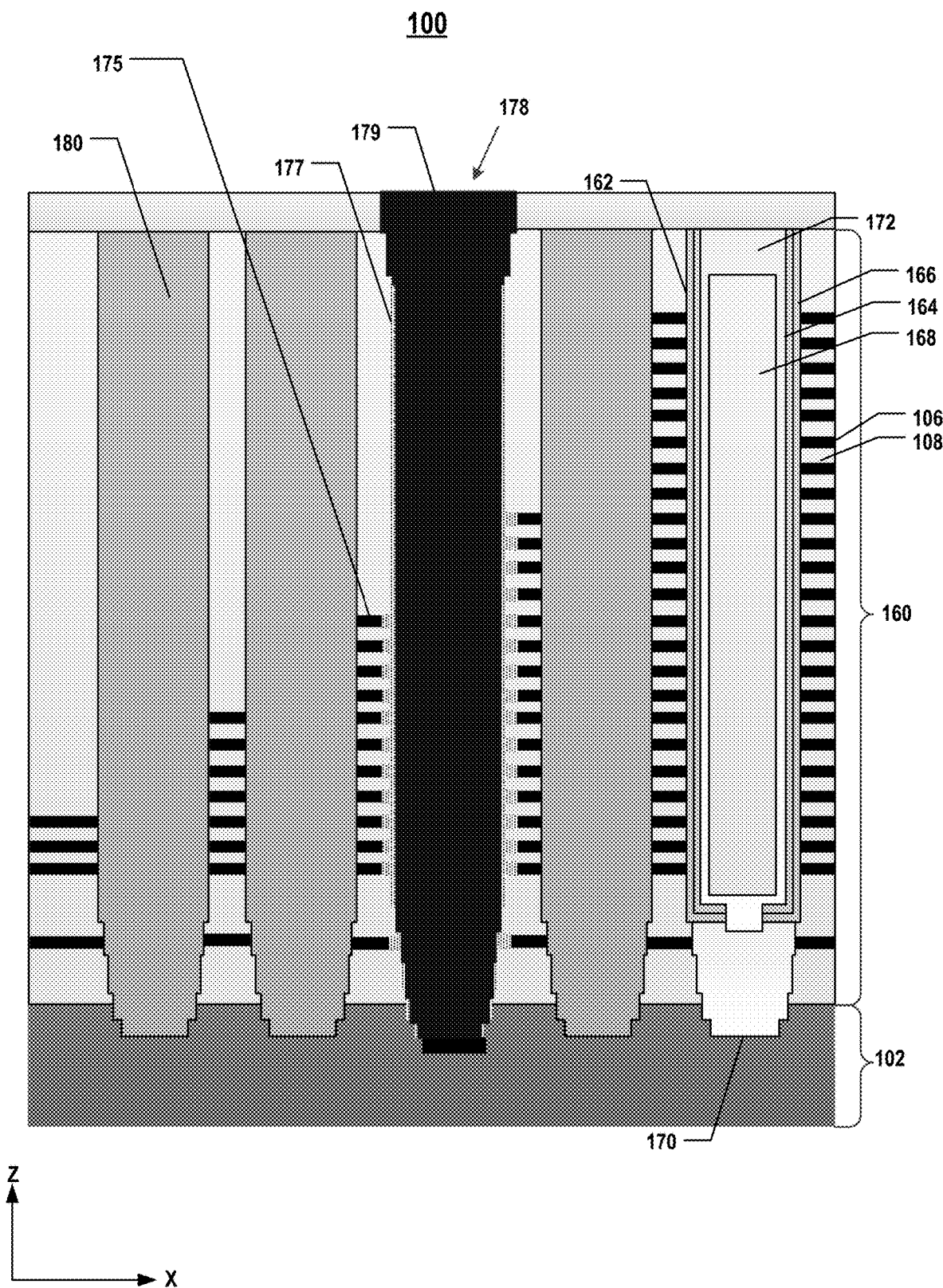
FIG. 1D illustrates a cross-sectional view of the 3D memory device shown in FIG. 1A along an A-A' direction, according to some embodiments of the present disclosure.
Figure 3:
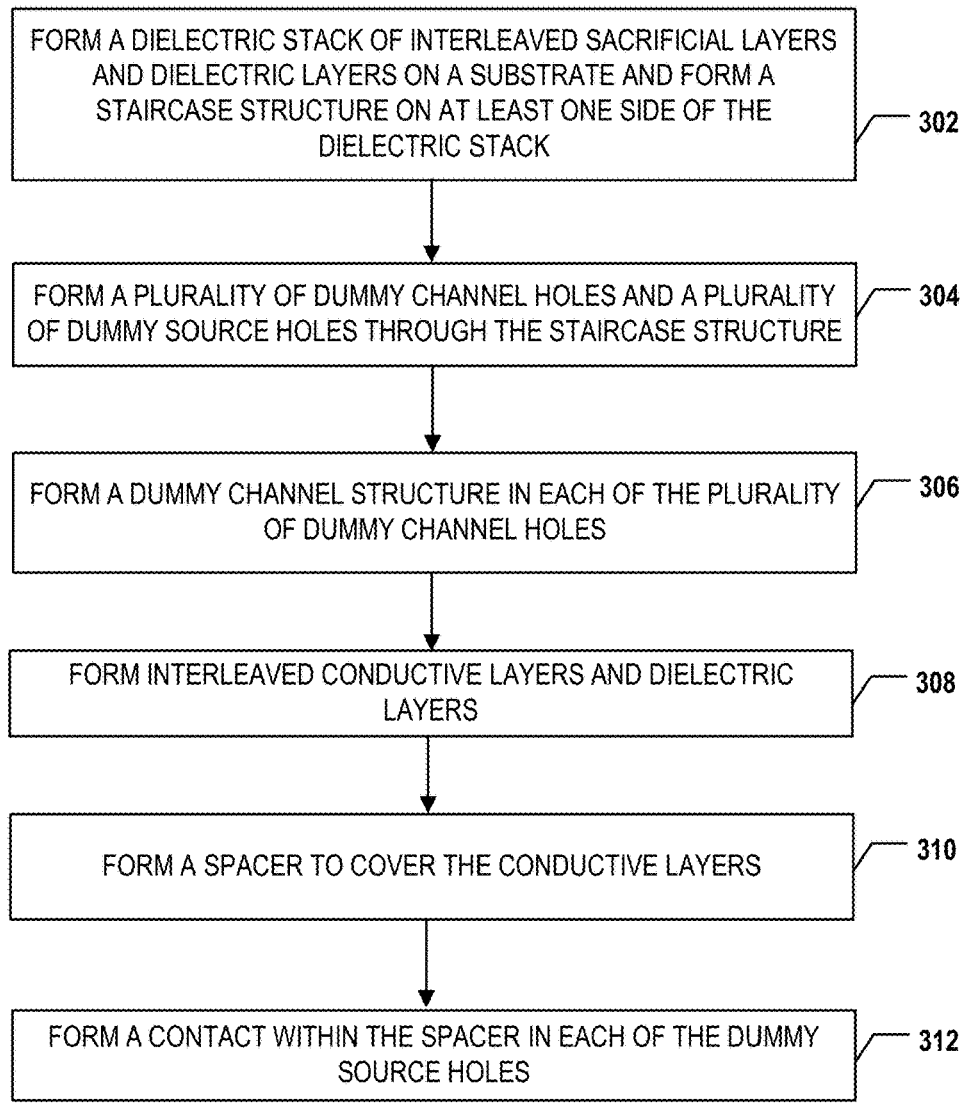
FIG. 3 illustrates a flowchart of an exemplary method for forming a 3D memory device, according to some embodiments of the present disclosure.
Figure 4:
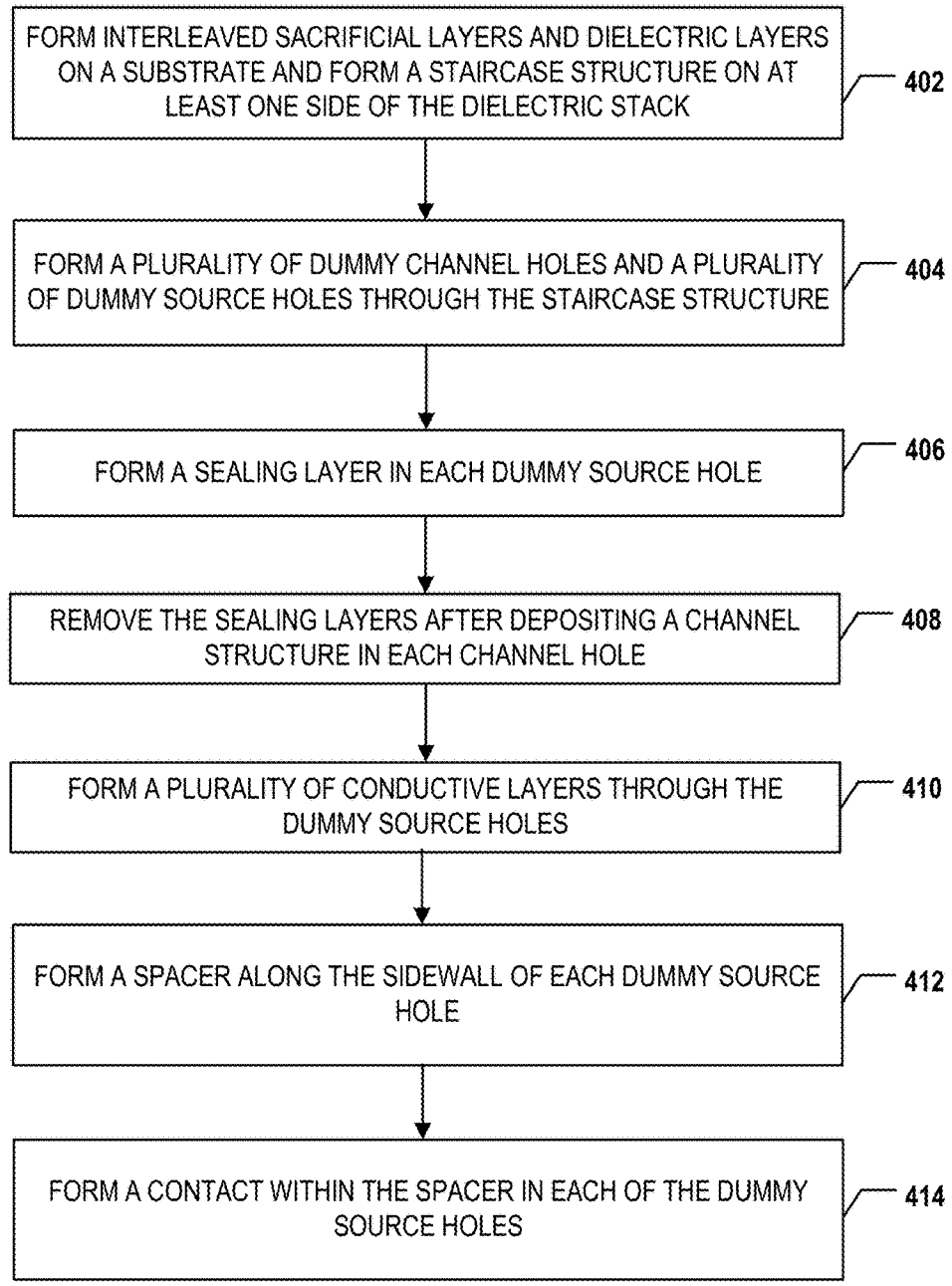
FIG. 4 illustrates a flowchart of another exemplary method for forming a 3D memory device, according to some embodiments of the present disclosure.

FIGS. 1A-1C illustrate plan views of exemplary 3D memory devices, according to some embodiments. FIG. 1D illustrates a cross-sectional view of the 3D memory device shown in FIG. 1A. FIGS. 2A-2L illustrate cross-sectional views of the exemplary 3D memory device at various stages of an exemplary fabrication process, according to some embodiments. FIGS. 3 and 4 each illustrates an exemplary method to form a 3D memory device, according to some embodiments.

FIG. 1A illustrates a plan view of an exemplary 3D memory device 100. 3D memory device 100 may include a memory region 150. Memory region 150 may include an inner region 116 (also known as a "core array region") and an outer region 118 (also known as a "staircase region"). In some embodiments, inner region 116 is the center region of memory region 150 where an array of memory strings 104 (e.g., NAND memory strings) are formed, and outer region 118 is the remaining region of memory region 150 surrounding inner region 116 (including the sides and edges) without memory strings 104.

Memory strings 104 may be arranged in an array in inner region 116. Memory strings 104 may be arranged in any suitable pattern. Depending on the fabrication and/or design requirements, any suitable number of memory strings 104 may be formed in inner region 116.

Staircase region 118 may include a plurality of staircase contacts 122, a plurality of dummy channel structures 124, and a plurality of dummy source structures 126 distributed among dummy channel structures 124 and staircase contacts 122. Staircase contacts 122, dummy channel structures 124, and/or dummy source structures 126 may be arranged in any suitable pattern, such as an array, in staircase region 118. As shown in FIG. 1A, multiple dummy source structures, such as the four dummy source structures indicated by a diamond shape 146, may surround a staircase contact, such as staircase contact 122. The four dummy source structures indicated by 146 may be located adjacent to staircase contact 122 (e.g., there is no other components such as dummy channel structures, dummy source structures, and staircase contacts between staircase contact 122 and each of the four dummy source structures. The four dummy source structures indicated by 146 may be spaced with nominally equal lateral distances to staircase contact 122. In other words, the four dummy source structures indicated by 146 may be evenly or uniformly distributed around staircase contact 122.

As shown in FIG. 1A, at least two dummy source structures may be arranged in a first row 132 that extends along a first lateral direction (e.g., x direction). For example, row 132 includes two dummy source structures. Another two dummy source structures may be arranged in a second row 134 that extends along a second lateral direction (e.g., y direction) that is perpendicular to the first lateral direction (e.g., x direction). For example, row 134 includes two dummy source structures.

A plurality of dummy channel structures, such as the four dummy channel structures indicated by square shape 148, may surround a staircase contact. The four dummy channel structures may be spaced with nominally equal lateral distances to the staircase contact, as shown in FIG. 1A. In other words, the dummy channel structures surrounding a staircase contact may be evenly distributed around the staircase contact.

In some embodiments, at least two of the plurality of dummy channel structures may be arranged in a third row 136 that extends along a third lateral direction in parallel with the first or the second lateral direction. For example, row 136 includes four dummy channel structures (two in the center and two others at both ends). Row 136 is in parallel to the y direction, in parallel to row 134, as shown in FIG. 1A.

The plurality of dummy source structures may interleave with the plurality of dummy channel structures. For example, the dummy source structures may be arranged among the array of dummy channel structures, where one or more dummy channel structures may be located between two dummy source structures, and vice versa.

In some embodiments, at least one dummy source structure may be located between two staircase contacts. For example, FIG. 1A shows that two dummy source structures are located between staircase contacts 122 and 122'. FIG. 1B shows another embodiment in which two dummy source structures are located between staircase contacts 123 and 123', while one dummy source structure is located between staircase contacts 123' and 123". FIG. 1C shows yet another embodiment in which one dummy source structure is located between staircase contacts 125 and 125', and one dummy source structure is located between stair case contacts 125' and 125". Other numbers of dummy source structures may also be disposed between two staircase contacts.

In some embodiments, a subset of the dummy channel structures may be surrounded by a plurality of dummy source structures. Referring to FIG. 1A, four dummy channel structures indicated by dashed-line square shape 142 are surrounded by eight dummy source structures indicated by an octagon 144. In the embodiment shown in FIG. 1B, two dummy channel structures indicated by dashed-line rectangular shape 143 are surrounded by six dummy source structures indicated by a hexagon 145. In the embodiment shown in FIG. 1C, one dummy channel structure indicated by dashed-line square shape 147 is surrounded by four dummy source structures indicated by a diamond 149. Any suitable number of dummy channel structures may be surrounded by any suitable number of dummy source structures.

In some embodiments, two dummy source structures and two dummy channel structures may be aligned along a first row extending in a first lateral direction. For example, as shown in FIG. 1A, row 132 includes two dummy channels structures and two dummy source structures aligned along the x direction. The two dummy source structures are separated by the two dummy channel structure. In another example, as shown in FIG. 1B, two dummy source structures are separated by one dummy channel structure in row 133, while row 133 includes two dummy channel structures and two dummy source structures aligned along the x direction. Returning back to FIG. 1A, two other dummy source structures and two other dummy channel structures are aligned along a second row 134 extending in the y direction perpendicular to the x direction. Row 132 and row 134 cross each other at a dummy channel structure, as shown in FIG. 1A.

While FIGS. 1A-1C illustrate certain exemplary arrangements of dummy source structures and dummy channel structures, it is noted that dummy source structures 126 and/or dummy channel structures 124 may be distributed or arranged in any suitable arrangement in staircase region 118. For example, dummy source structures 126 may be arranged in a pattern (e.g., arrangement with a same shape repeated at a regular interval) in the plan view. In some embodiments, dummy source structures 126 are arranged in an array.

In some embodiments, the number of dummy source structures 126 in each row and the number/arrangement of dummy channel structures 124 aligned with dummy source structure 126 may vary. For example, in a row, each two adjacent dummy source structures 126 may be separated by more or less than two dummy channel structures. In some embodiments, the number of dummy source structures surrounding one or more dummy channel structure 124 may be more or less than eight, six, or four. The lateral dimensions (e.g., diameter) of a dummy source structure 126 may be nominally the same as the lateral dimensions (e.g., diameter) of dummy channel structure 124 and/or memory string 104. The specific arrangement of dummy source structures 126 and dummy channel structure 124 may be determined based on different fabrication and/or design requirements, and should not be limited by the embodiments of the present disclosure.

The arrangement of dummy source structures 126 may improve the fabrication and device performance of 3D memory device 100 in many aspects. For example, by removing GLSs from the staircase region 118, more space is available for other structures such as staircase contacts 122. The dummy source structures 126 are distributed amongst dummy channel structures 124 and also surround staircase contacts 122 of nominally same lateral distances to the respective staircase contacts 122. In the gate-replacement process, conductive material for forming the gate electrodes may travel nominally same distances to surrounding lateral recesses formed after the removal of sacrificial layers. This may facilitate the gate electrodes to be formed with improved uniformity and quality, reducing the resistivity of the gate electrodes. The arrangement of dummy source structures 126 also allows more staircase contacts to be located closer and more uniformly. Also, the arrangement and dimensions of the dummy source structures 126 can result in a reduced change of boundary conditions of dummy channel holes at different locations in staircase region 118 during the etching process. The lateral dimensions of the formed dummy channel holes may thus have improved uniformity. Further, the number of dummy channel structures may be flexibly determined in staircase region 118. This may further increase the stability of staircase region 118 during etching processes. The lateral dimensions and distribution of dummy source structures 126 may also reduce warpage bias of 3D memory device 100, thus reducing the variations to the surface flatness of 3D memory device 100. The symmetrical architecture of dummy channel structures and dummy source structures can improve the performance and efficiency of etching processes. Different layouts, patterns, and designs may be adopted based on the size of the staircase region.

FIG. 1D illustrates a cross-sectional view of an exemplary 3D memory device 100 along the A-A' direction shown in FIG. 1A, according to some embodiments of the present disclosure. 3D memory device 100 can include a substrate 102, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof.

3D memory device 100 can include memory array devices above substrate 102. It is noted that x and z axes/directions are included in FIG. 1D to further illustrate the spatial relationship of the components in 3D memory device 100. Substrate 102 includes two lateral surfaces extending laterally in the x-y plane: a top surface on the front side of the wafer on which 3D memory device 100 can be formed, and a bottom surface on the backside opposite to the front side of the wafer. The z axis is perpendicular to both the x and y axes. As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the z-direction (the vertical direction perpendicular to the x-y plane) when the substrate is positioned in the lowest plane of the semiconductor device in the z-direction. The same notion for describing spatial relationship is applied throughout the present disclosure.

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 100 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches, not shown) is flipped and faces down toward the memory array device (e.g., NAND memory strings) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 100 is a NAND Flash memory device in which memory cells are provided in the form of an array of NAND memory strings 104 each extending vertically above substrate 102. The NAND memory strings 104 can extend through a plurality of pairs each including a conductive layer 106 and a dielectric layer 108 (referred to herein as "conductor/dielectric layer pairs"). The stacked conductor/dielectric layer pairs are also referred to herein as a "memory stack" 160. In some embodiments, an insulation layer (not shown) is formed between substrate 102 and memory stack 160. The number of the conductor/dielectric layer pairs in memory stack 160 (e.g., 32, 64, 96, or 128) determines the number of memory cells in 3D memory device 100. Memory stack 160 can include interleaved conductive layers 106 and dielectric layers 108. At least on one side in the lateral direction, memory stack 160 can include a staircase structure 175. Conductive layers 106 and dielectric layers 108 in memory stack 160 can alternate in the vertical direction. Conductive layers 106 can include conductive materials including, but not limited to, tungsten (W), cobalt (Co), copper (Cu), aluminum (Al), polysilicon, doped silicon, silicides, or any combination thereof. Dielectric layers 108 can include dielectric materials including, but not limited to, silicon oxide, silicon nitride, silicon oxynitride, or any combination thereof.

As shown in FIG. 1D, memory string 104 can include a channel structure 162 extending vertically through memory stack 160. Channel structure 162 can include a channel hole filled with semiconductor materials (e.g., as a semiconductor channel 164) and dielectric materials (e.g., as a memory film 166). In some embodiments, semiconductor channel 164 includes silicon, such as amorphous silicon, polysilicon, or single crystalline silicon. In some embodiments, memory film 166 is a composite layer including a tunneling layer, a storage layer (also known as a "charge trap layer"), and a blocking layer. The remaining space of the channel hole of channel structure 162 can be partially or fully filled with a capping layer 168 including dielectric materials, such as silicon oxide. Channel structure 162 can have a cylinder shape (e.g., a pillar shape). Capping layer 168, semiconductor channel 164, the tunneling layer, the storage layer, and the blocking layer are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, memory film 166 can include a composite layer of silicon oxide/silicon oxynitride (or silicon nitride)/silicon oxide (ONO).

In some embodiments, conductive layer 106 in memory stack 160 functions as a gate electrode/gate conductor/gate line of memory cells in memory string 104. Conductive layer 106 can include multiple control gates of multiple NAND memory cells and can extend laterally as a word line ending at the edge of memory stack 160 (e.g., in staircase structure 175 of memory stack 160). In some embodiments, the word lines extend in the x-direction perpendicular to both the y-direction and z-direction. The bit lines extend in the y-direction perpendicular to both the x-direction and z-direction. In some embodiments, memory cell transistors in memory string 104 include gate conductors (e.g., parts of conductive layers 106 that abut channel structure 162) made from tungsten, adhesion layers (not shown) including titanium/titanium nitride (Ti/TiN) or tantalum/tantalum nitride (Ta/TaN), gate dielectric layers (not shown) made from high-k dielectric materials, and channel structure 162.

In some embodiments, memory string 104 further includes a semiconductor plug 170 in the lower portion (e.g., at the lower end) of memory string 104. As used herein, the "upper end" of a component (e.g., memory string 104) is the end farther away from substrate 102 in the z-direction, and the "lower end" of the component (e.g., memory string 104) is the end closer to substrate 102 in the z-direction when substrate 102 is positioned in the lowest plane of 3D memory device 100. Semiconductor plug 170 can include a semiconductor material, such as silicon, which is epitaxially grown from substrate 102 in any suitable directions. It is understood that in some embodiments, semiconductor plug 170 includes single crystalline silicon, the same material of substrate 102. In other words, semiconductor plug 170 can include an epitaxially-grown semiconductor layer that is the same as the material of substrate 102. In some embodiments, part of semiconductor plug 170 is over the top surface of substrate 102 and in contact with semiconductor channel 164. Semiconductor plug 170 can function as a channel controlled by a source select gate of memory string 104.

In some embodiments, memory string 104 further includes a channel plug 172 in the upper portion (e.g., at the upper end) of memory string 104. Channel plug 172 can be in contact with the upper end of semiconductor channel 164. Channel plug 172 can include semiconductor materials (e.g., polysilicon) or conductive materials (e.g., metals). In some embodiments, channel plug 172 includes an opening filled with Ti/TiN or Ta/TaN as an adhesion layer and tungsten as a conductor layer. By covering the upper end of channel structure 162 during the fabrication of 3D memory device 100, channel plug 172 can function as an etch stop layer to prevent etching of dielectrics filled in channel structure 162, such as silicon oxide and silicon nitride. In some embodiments, channel plug 172 also functions as the drain of memory string 104.

In some embodiments, 3D memory device 100 further includes dummy channel structures 180. Each dummy channel structure 180 extends vertically through staircase structure 175. Dummy channel structure 180 may include dielectric materials such as silicon-oxide. In some embodiments, dummy channel structure 180 may reach substrate 102 and in contact with substrate 102. Dummy channel structure 180 may have nominally the same diameter as the diameter of channel structure 162.

In some embodiments, 3D memory device 100 further includes dummy source structures 178. Each dummy source structure 178 can extend vertically through staircase structure 175. In some embodiments, dummy source structure 178 includes a dummy source hole filled with conductive materials as a contact 179. Dummy source structure 178 can further include a spacer 177 made of any suitable dielectric materials (e.g., silicon oxide) between contact 179 and memory stack 160 to electrically separate surrounding conductive layers 106 in memory stack 160 from contact 179. As a result, dummy source structures 178 can laterally separate 3D memory device 100 into multiple memory regions, such as memory blocks. In some embodiments, dummy source structures 178 may function as interconnects to connect 3D memory device 100 with other peripheral devices.

As described below in detail, due to the limitations of etching process (e.g., deep reactive ion etch (DRIE)) for forming the dummy source hole, in particular when the levels of memory stack 160 continue to increase, the sidewall profile of the dummy source hole is not straight up as shown in FIG. 1D, but rather being tilted. In some embodiments, the lateral dimension of the dummy source hole (and dummy source structure 178) decreases from top to bottom. That is, the lateral dimension of dummy source structures 178 in its upper portion can be greater than the lateral dimension in its lower portion.

FIGS. 2A-2L illustrate an exemplary fabrication process for forming a 3D memory device, according to some embodiments of the present disclosure. FIG. 3 illustrates a flowchart of an exemplary method 300 for forming a 3D memory device, according to some embodiments of the present disclosure. FIG. 4 illustrates a flowchart of another exemplary method 400 for forming a 3D memory device, according to some embodiments of the present disclosure. Examples of the 3D memory device depicted in FIGS. 2A-2L and 3-4 include 3D memory device 100 depicted in FIGS. 1A-1D. FIGS. 2A-2L and 3-4 will be described together. It is understood that the operations shown in methods 300 and 400 are not exhaustive and that other operations can be performed as well before, after, or between any of the illustrated operations. Further, some of the operations may be performed simultaneously, or in a different order than shown in FIGS. 3-4.

Referring to FIG. 3, method 300 starts at operation 302, in which a dielectric stack is formed on a substrate and a staircase structure is formed on at least one side of the dielectric stack. The substrate can be a silicon substrate. The dielectric stack can include interleaved sacrificial layers and dielectric layers. In the example of method 400 in FIG. 4, at operation 402, interleaved sacrificial layers and dielectric layers are alternatingly deposited on a substrate and a staircase structure on at least one side of the interleaved sacrificial layers and dielectric layers.

Figure 2A:
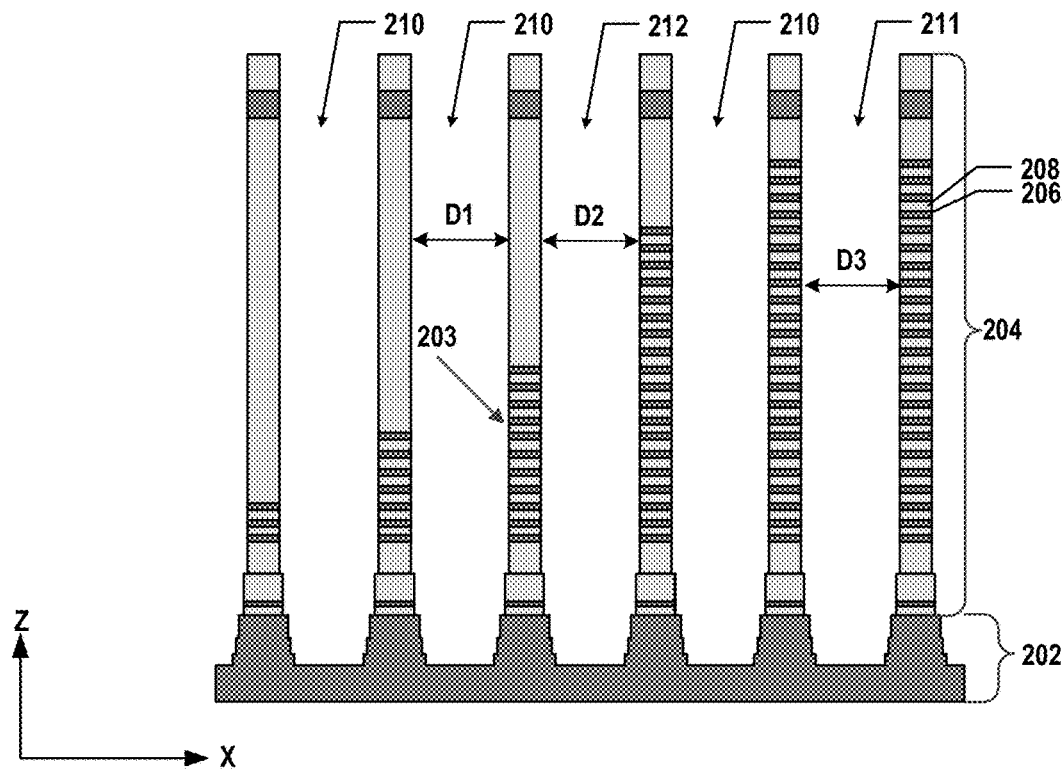
FIGS. 2A-2L illustrate an exemplary fabrication process for forming a 3D memory device, according to some embodiments of the present disclosure.

Referring to FIG. 2A, a dielectric stack 204 including a plurality pairs of a first dielectric layer (also known as a "sacrificial layer" 206) and a second dielectric layer 208 (together referred to herein as "dielectric layer pairs") are formed on a silicon substrate 202. That is, dielectric stack 204 includes interleaved sacrificial layers 206 and dielectric layers 208, according to some embodiments. Dielectric layers 208 and sacrificial layers 206 can be alternatingly deposited on silicon substrate 202 to form dielectric stack 204. In some embodiments, each dielectric layer 208 includes a layer of silicon oxide, and each sacrificial layer 206 includes a layer of silicon nitride. Dielectric stack 204 can be formed by one or more thin film deposition processes including, but not limited to, chemical vapor deposition (CVD), physical vapor deposition (PVD), atomic layer deposition (ALD), or any combination thereof. In some embodiments, an insulation layer (not shown) is formed between silicon substrate 202 and dielectric stack 204 by depositing dielectric materials, such as silicon oxide, on silicon substrate 202.

As illustrated in FIG. 2A, staircase structures 203 are formed on the sides of dielectric stack 204. Staircase structure 203 can be formed by the so-called "trim-etch" processes, which, in each cycle, trim (e.g., etching incrementally and inwardly, often from all directions) a patterned photoresist layer, followed by etching the exposed portions of the dielectric/sacrificial layer pair using the trimmed photoresist layer as an etch mask to form one step of staircase structure 203.

Method 300 proceeds to operation 304, as illustrated in FIG. 3, in which a plurality of dummy channel holes and a plurality of dummy source holes are formed through the staircase structure. In the example of method 400 in FIG. 4, at operation 404, a plurality of dummy channel holes and a plurality of dummy source holes are formed through the interleaved sacrificial layers and dielectric layers in the staircase structure. The plurality of dummy channel holes and a plurality of dummy source holes can be simultaneously formed through the staircase structure by, e.g., performing an anisotropic etching process to remove portions of staircase structure using an etch mask. In addition, the plurality of dummy channel holes and the plurality of dummy source holes can be simultaneously formed with the channel holes in the dielectric stack by the same etching process. The plurality of dummy source holes may be aligned with a portion of the plurality of dummy channel holes in a row along a lateral direction (e.g., x direction). A subset of the dummy channel holes may be surrounded by a plurality of dummy source holes.

As illustrated in FIG. 2A, a plurality of dummy channel holes 210 and dummy source holes 212 are simultaneously formed through staircase structure 203. A plurality of channel holes 211 may also be simultaneously formed through an inner region of dielectric stack 204. In some embodiments, an etching mask (not shown) is patterned on dielectric stack 204 by photolithography, development, and etching. The etching mask can be a photoresist mask or a hard mask patterned based on a photolithography mask. The photolithography mask and/or etching mask can have patterns of dummy channel holes 210, dummy source holes 212, and/or channel holes 211 thereon. In some embodiments, the etching mask includes an array of first openings for forming dummy channel holes 210 and second openings for forming dummy source holes 212. The first openings and the second openings may have nominally same lateral dimensions (e.g., diameters). In some embodiments, dummy channel holes 210 and dummy source holes 212 have nominally same lateral dimensions (e.g., diameters). In some embodiments, dummy channel holes 210, dummy source holes 212, and channel holes 211 have nominally same lateral dimensions (e.g., diameters).

As illustrated in FIG. 2A, parts of dielectric stack 204 are etched through by one or more wet etching and/or dry etching processes, such as DRIE, using the patterned etching mask to simultaneously form dummy channel holes 210 and dummy source holes 212 in a pattern defined by the photolithography mask and/or etching mask. In some embodiments, dummy channel holes 210 and dummy source holes 212 extend vertically further into the upper portion of silicon substrate 202. The etching process through dielectric stack 204 may not stop at the top surface of silicon substrate 202 and may continue to etch part of silicon substrate 202. In some embodiments, a separate etching process is used to etch part of silicon substrate 202 after etching through dielectric stack 204. In some embodiments, the lateral dimensions (e.g., diameter D1) of dummy channel hole 210 are nominally the same as the lateral dimensions (e.g., diameter D2) of dummy source hole 212, and may also be nominally the same as the lateral dimensions (e.g., diameter D3) of channel hole 211.

Method 300 proceeds to operation 306, as illustrated in FIG. 3, in which a dummy channel structure is formed in each of the dummy channel holes. In the example of method 400 in FIG. 4, at operation 406, a sealing layer is formed in each of the dummy source holes. In some embodiments, a channel structure is formed in each of the channel hole. A semiconductor plug is formed in the lower portion of each of the channel holes, and a channel plug is formed in the upper portion of each of the channel holes.

Figure 2B:
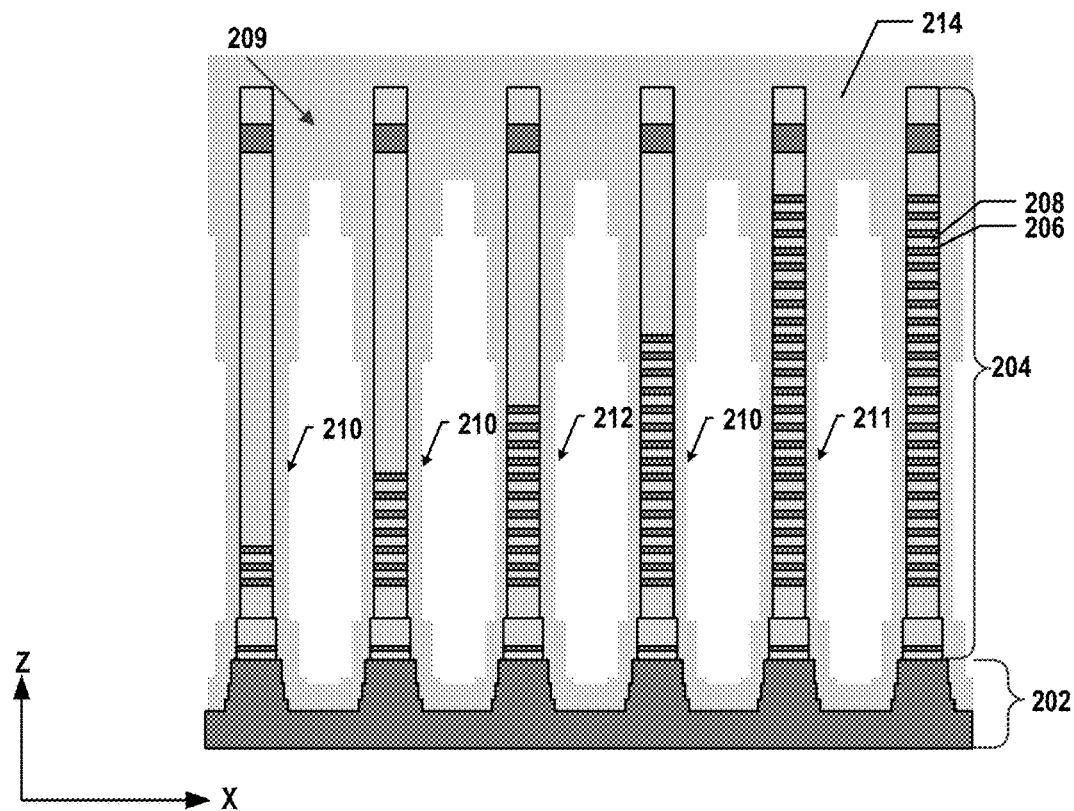

As illustrated in FIG. 2B, a sealing layer 214 is formed to fill in and cover dummy channel holes 210, dummy source holes 212, and channel hole 211. Sealing layer 214 can be formed by depositing a sacrificial layer, such as polysilicon, which is to be later removed, to partially fill in and cover channel holes 211 and dummy source holes 212 using one or more thin film deposition processes including ALD, CVD, PVD, any other suitable processes, or any combination thereof. In some embodiments, sealing layer 214 is formed by a rapid-sealing deposition process. Dummy channel structures 209 are formed with dummy channel holes 210 filled with sealing layer 214.

Figure 2C:
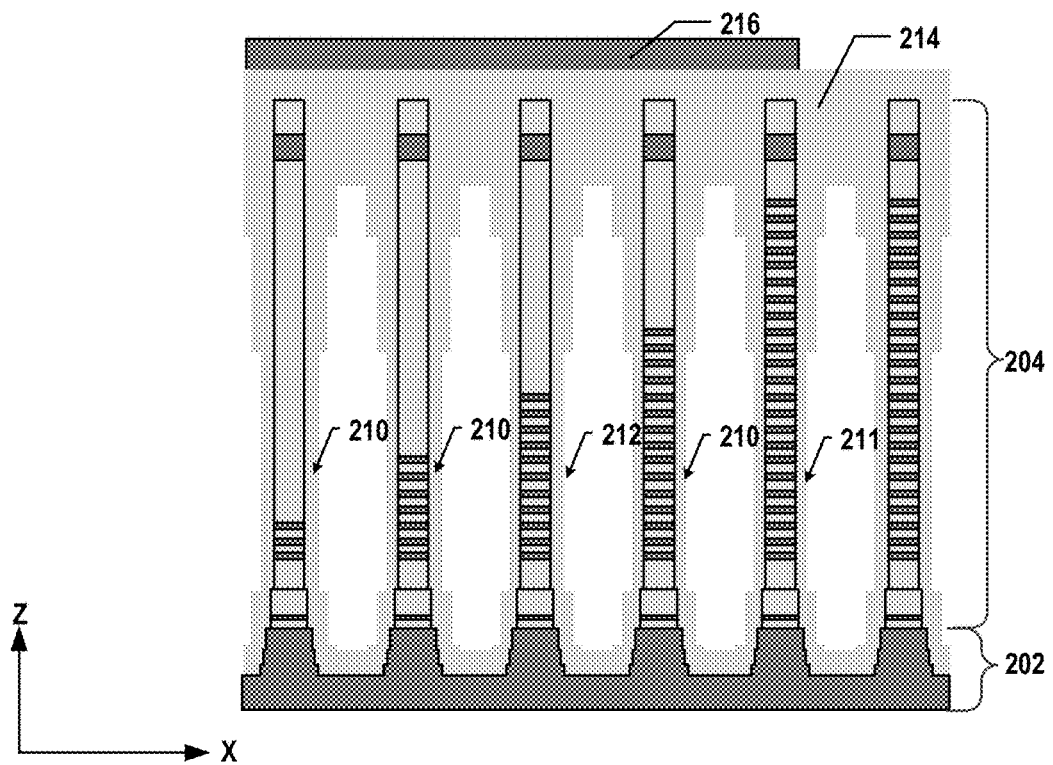
Figure 2D:
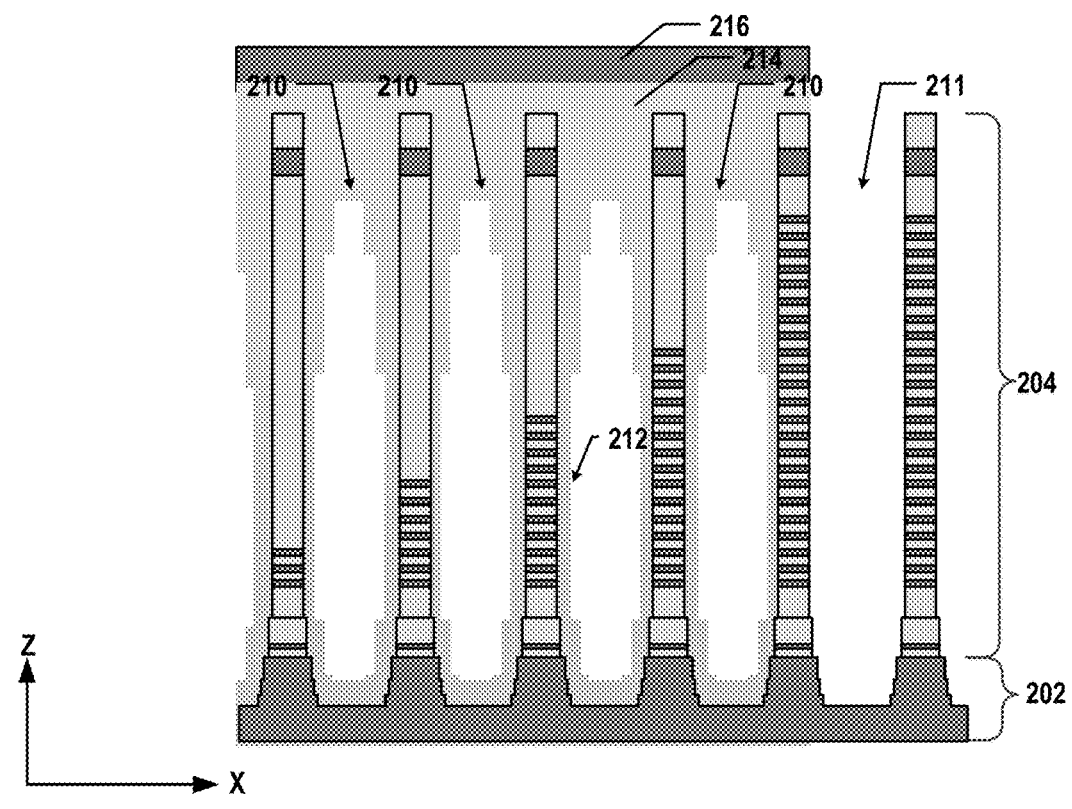

After sealing layer 214 is formed, channel hole 211 is re-opened. As illustrated in FIG. 2C, a photoresist layer 216 (as a channel hole re-open mask) is patterned to cover part of sealing layer 214 right above dummy channel holes 210 and dummy source hole 212 using photolithography and development processes. As illustrated in FIG. 2D, parts of sealing layer 214 right above channel hole 211 are removed using wet etching and/or dry etching processes since they are not covered by photoresist layer 216, leaving sealing layer 214 to fill in and cover only dummy source hole 212 and dummy channel holes 210. Channel hole 211 are thereby re-opened for later processes.

Figure 2E:
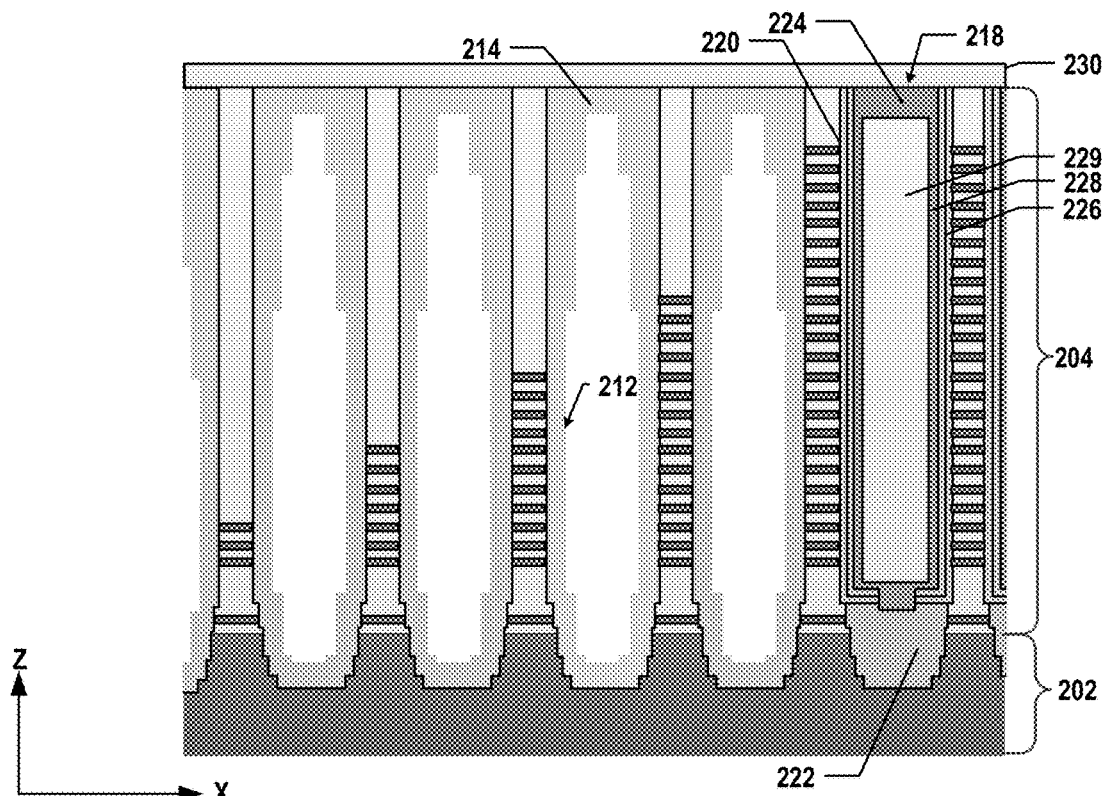

As illustrated in FIG. 2E, a semiconductor plug 222 is formed by filling the lower portion of channel hole 211 (shown in FIG. 2D) with a semiconductor material (e.g., single crystalline silicon epitaxially grown from silicon substrate 202 or polysilicon deposited over silicon substrate 202) in any suitable directions (e.g., from bottom surface and/or side surface). The fabrication processes for epitaxially growing semiconductor plug 222 can include, but not limited to, vapor-phase epitaxy (VPE), liquid-phase epitaxy (LPE), molecular-beam epitaxy (MBE), or any combinations thereof.

As illustrated in FIG. 2E, a channel structure 220 is formed above semiconductor plug 222 in channel hole 211. Channel structure 220 can include a memory film 226 (e.g., including a blocking layer, a storage layer, and a tunneling layer) and a semiconductor channel 228 formed above semiconductor plug 222. In some embodiments, memory film 226 is first deposited along the sidewall and bottom surface of channel hole 211, and semiconductor channel 228 is then deposited over memory film 226 and above semiconductor plug 222. The blocking layer, storage layer, and tunneling layer can be sequentially deposited in this order using one or more thin film deposition processes, such as ALD, CVD, PVD, any other suitable processes, or any combination thereof, to form memory film 226. Semiconductor channel 228 can then be deposited on the tunneling layer using one or more thin film deposition processes, such as ALD, CVD, PVD, any other suitable processes, or any combination thereof. In some embodiments, a capping layer 229 is filled in the remaining space of channel hole 211 by depositing dielectric materials after the deposition of semiconductor channel 228, such as silicon oxide.

As illustrated in FIG. 2E, a channel plug 224 is formed in the upper portion of channel hole 211. In some embodiments, parts of memory film 226, semiconductor channel 228, and capping layer 229 on the top surface of dielectric stack 204 and in the upper portion of channel hole 211 can be removed by CMP, grinding, wet etching, and/or dry etching to form a recess in the upper portion of channel hole 211. Channel plug 224 then can be formed by depositing conductive materials, such as metals, into the recess by one or more thin film deposition processes, such as CVD, PVD, ALD, electroplating, electroless plating, or any combination thereof. A memory string 218 (e.g., a NAND memory strings) is thereby formed. In some embodiments, an insulation layer 230 including dielectric materials, such as silicon oxide, is formed on dielectric stack 204 after the formation of channel structures 220 of memory strings 218.

Figure 2F:
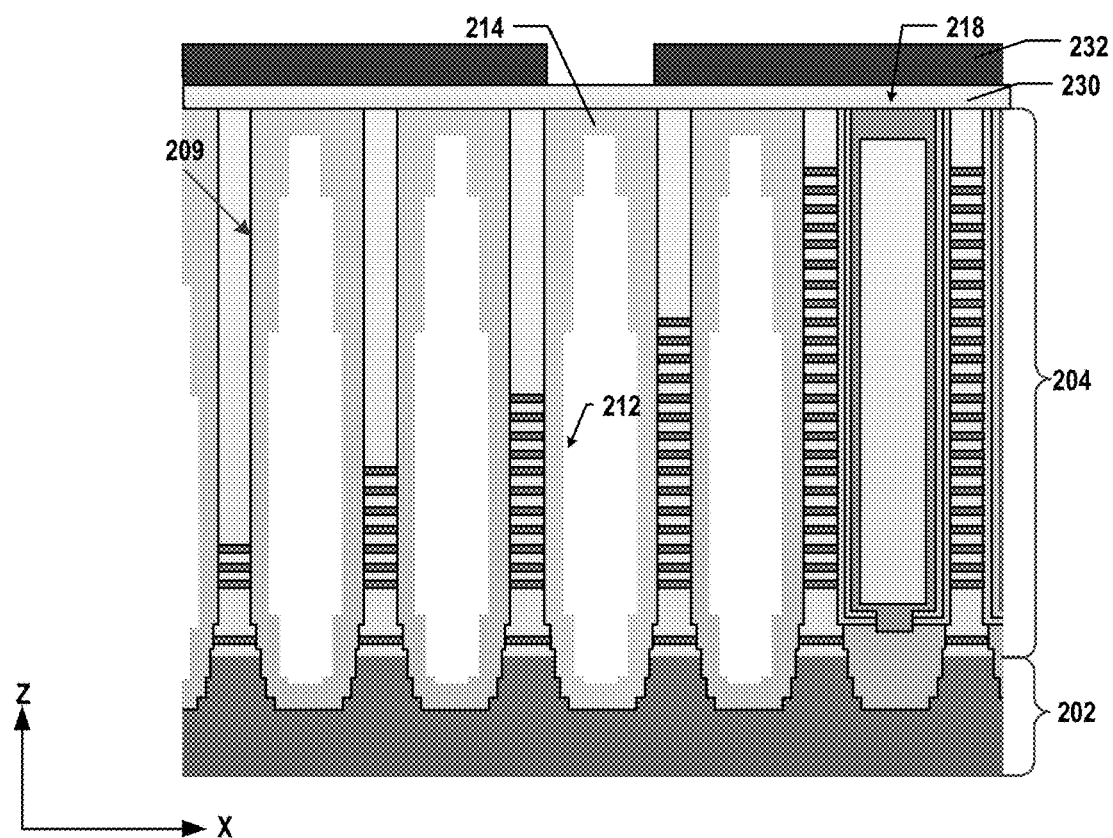
Figure 2G:
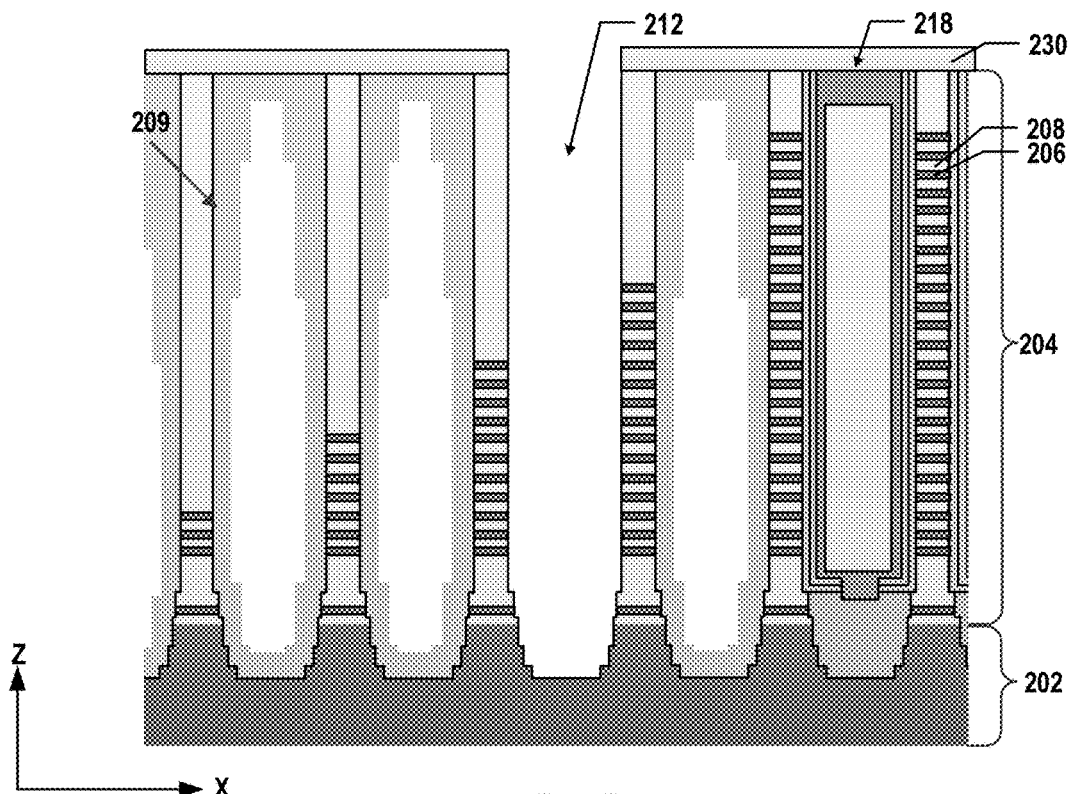

Method 400 proceeds to operation 408, as illustrated in FIG. 4, in which the sealing layer is removed from each of the dummy source holes after the formation of channel structures in channel holes. As illustrated in FIG. 2F, a photoresist layer 232 (as a dummy source hole re-open mask) is patterned to cover parts of insulation layer 230 right above memory strings 218 and dummy channel structures 209 using photolithography and development processes. As illustrated in FIG. 2G, part of insulation layer 230 right above dummy source hole 212 and sealing layer 214 that fills in and covers dummy source hole 212 (shown in FIG. 2F) are removed using wet etching and/or dry etching processes since they are not covered by photoresist layer 232 (shown in FIG. 2F). Dummy source holes 212 are thereby re-opened for later processes.

Method 300 proceeds to operation 308, as illustrated in FIG. 3, in which interleaved conductive layers and dielectric layers is formed in the staircase structure. In the example of method 400 in FIG. 4, at operation 410, a plurality of conductive layers is formed through the dummy source holes. In some embodiments, forming the interleaved conductive layers and dielectric layers includes etching the sacrificial layers in the dielectric stack, and depositing the conductive layers of the memory stack through the dummy source holes.

Figure 2H:
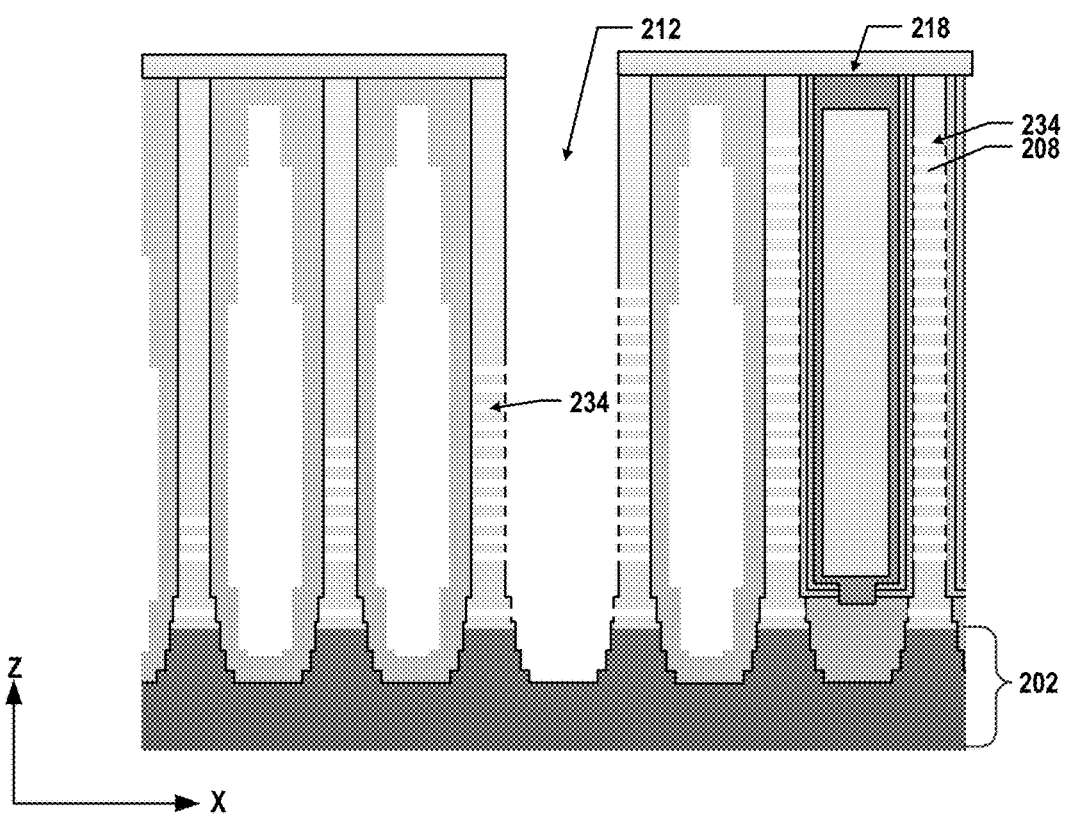

As illustrated in FIG. 2H, sacrificial layers 206 (shown in FIG. 2G) in dielectric stack 204 are removed by wet etching and/or dry etching selective to dielectric layers 208. Lateral recesses 234 connected to dummy source hole 212 can be formed after sacrificial layers 206 are completely etched away. In some embodiments, the etching process is facilitated by exposing dummy source hole 212 to hot phosphoric acid by which silicon nitride in sacrificial layers 206 is etched preferentially over silicon oxide in dielectric layers 208.

Figure 2I:
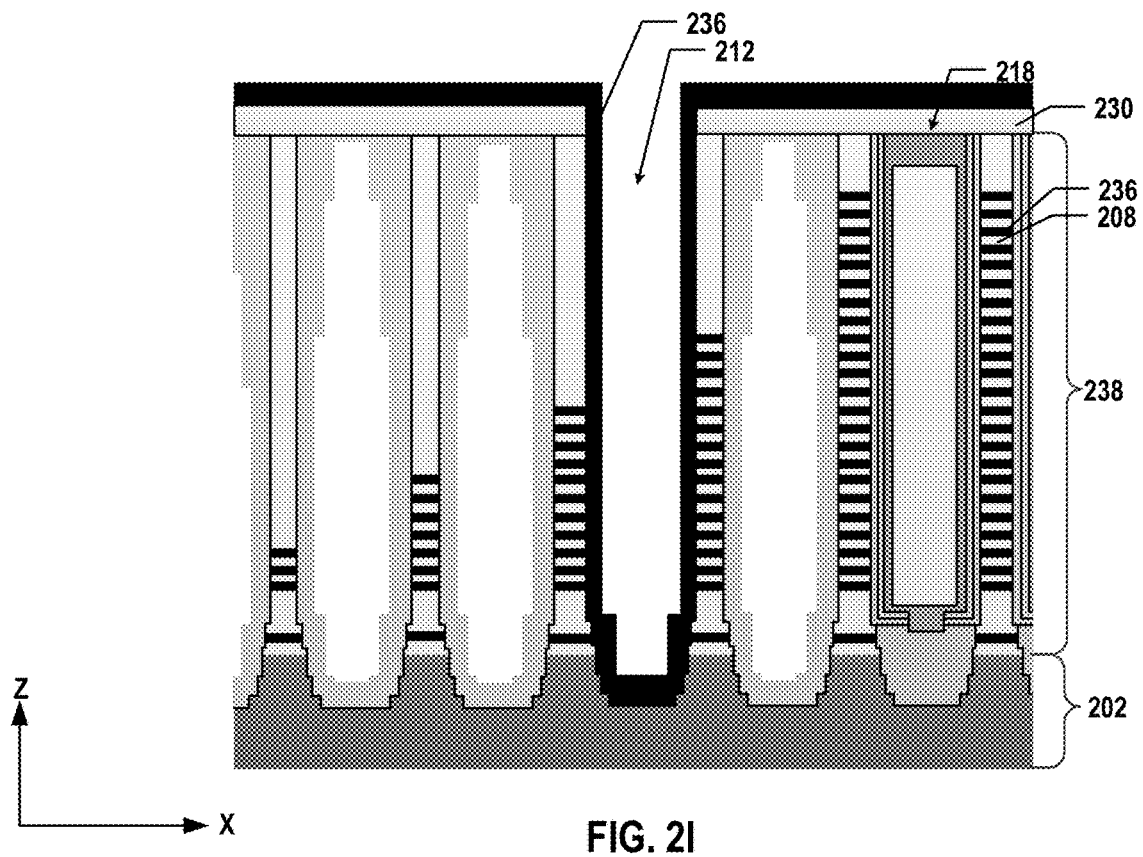

As illustrated in FIG. 2I, conductive layers 236 are formed along the sidewall of dummy source hole 212 and filling in lateral recesses 234 (shown in FIG. 2H). In some embodiments, conductive layer 236 is a composite layer including an adhesion layer and a conductor layer (e.g., a gate conductor/gate line). In some embodiments, a gate dielectric layer (not shown) is deposited prior to the deposition of conductive layer 236. The gate dielectric layer and conductive layer 236 can be formed by one or more thin film deposition processes, such as ALD, CVD, PVD, any other suitable processes, or any combination thereof. The gate dielectric layer can include dielectric materials including silicon nitride, high-k dielectrics, or any combination thereof. Conductive layer 236 can include conductive materials including, but not limited to, W, Co, Cu, Al, polysilicon, silicides, or any combination thereof. In some embodiments, the gate dielectric layer, adhesion layer, and conductor layer are each formed by CVD processes in which the reaction gases pass through dummy source hole 212 to lateral recesses 234 and are reacted and deposited along the sidewalls of dummy source hole 212 and lateral recesses 234. Conductive layers 236 thereby replace sacrificial layers 206 to transfer dielectric stack 204 into a memory stack 238.

Figure 2J:
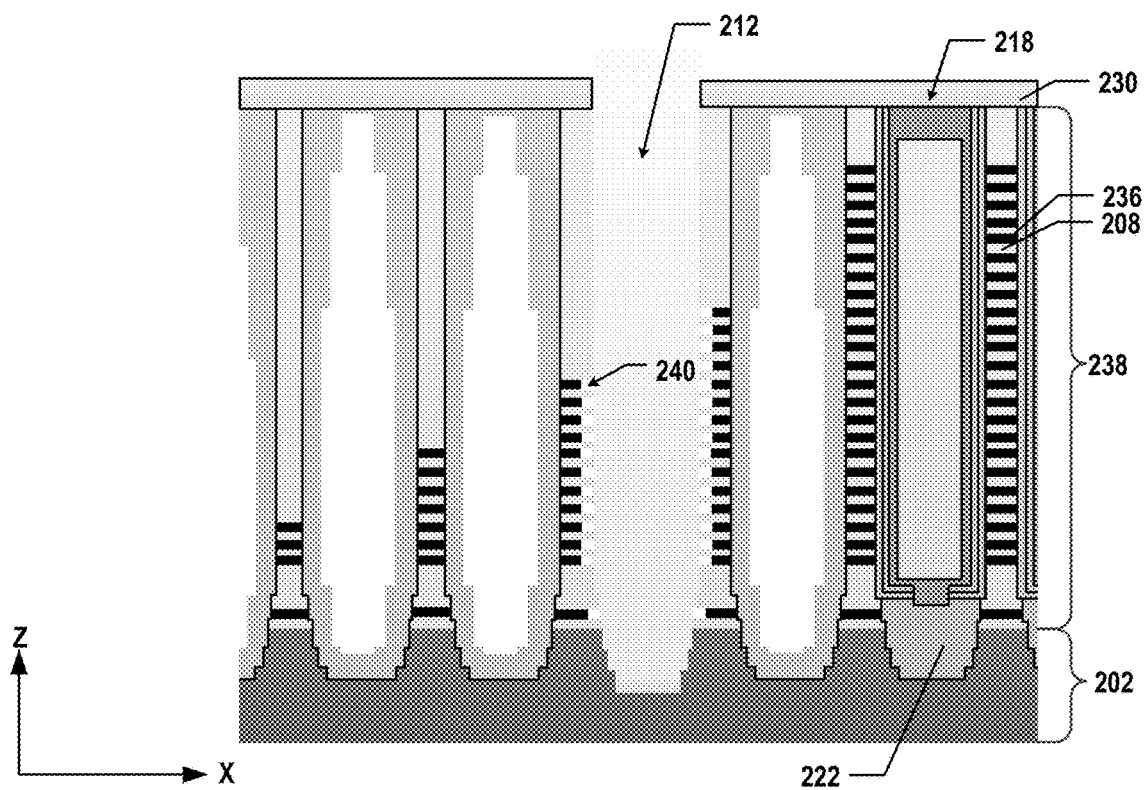

As illustrated in FIG. 2J, recesses 240 abutting the sidewall of dummy source hole 212 are formed by etching parts of conductive layers 236 of memory stack 238 that abut the sidewall of dummy source hole 212. In some embodiments, recesses 240 are formed by applying etchants to conductive layers 236 through dummy source hole 212 to completely remove the part of conductive layer 236 along the sidewall of dummy source hole 212 and further etch parts of conductive layers 236 in lateral recesses 234 (shown in FIG. 2H). The dimension of recess 240 can be controlled by the etching rate (e.g., based on the etchant temperature and concentration) and/or etching time.

Figure 2K:
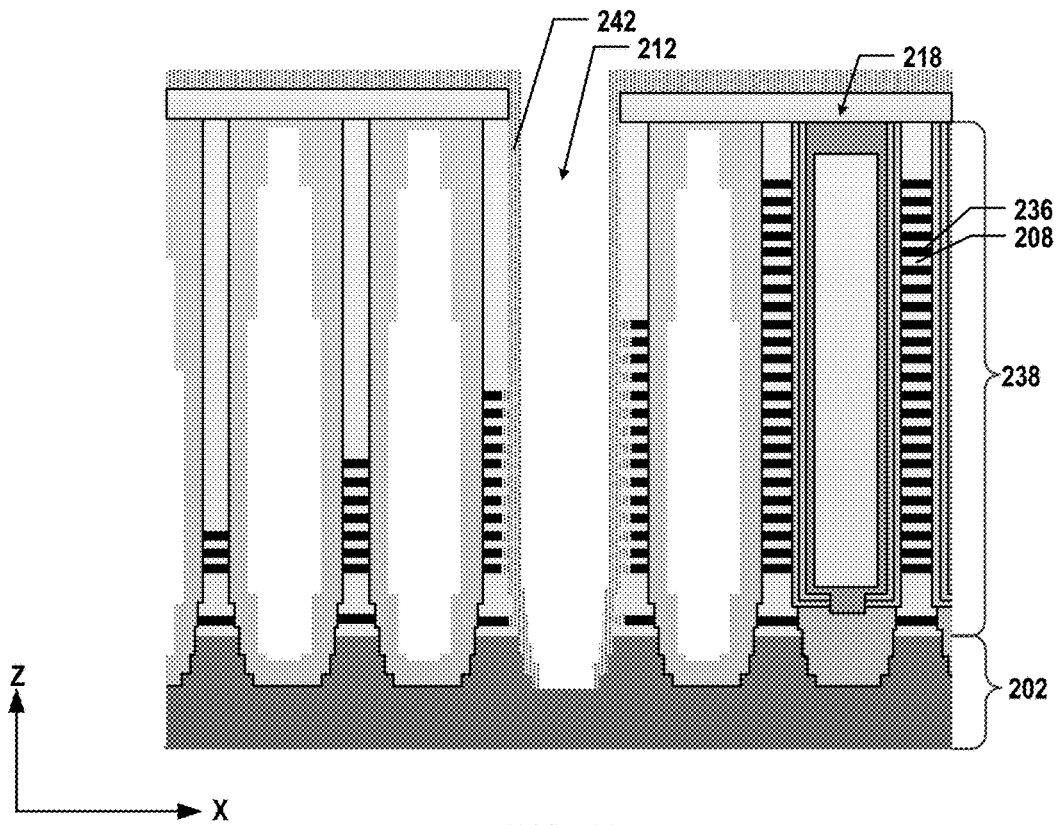

Method 300 proceeds to operation 310, as illustrated in FIG. 3, in which a spacer is formed along a sidewall of the dummy source hole to cover the conductive layers and electrically separate the conductive layers of the memory stack from a contact later formed in the dummy source hole. In the example of FIG. 4, at operation 412, a spacer is deposited along the sidewall of each of the dummy source holes. As illustrated in FIG. 2K, a spacer 242 is formed along the sidewall of dummy source hole 212 and in recesses 240 (shown in FIG. 2J) using one or more thin film deposition processes, such as ALD, CVD, PVD, any other suitable processes, or any combination thereof. Spacer 242 can include a single or composite layer of dielectric materials, such as silicon oxide and silicon nitride. By covering the sidewall of the dummy source hole as well as filling in recesses 240 with spacer 242, conductive layers 236 (e.g., gate lines) of memory stack 238 can be electrically separated from a contact later formed in dummy source hole 212 by spacer 242.

Figure 2L:
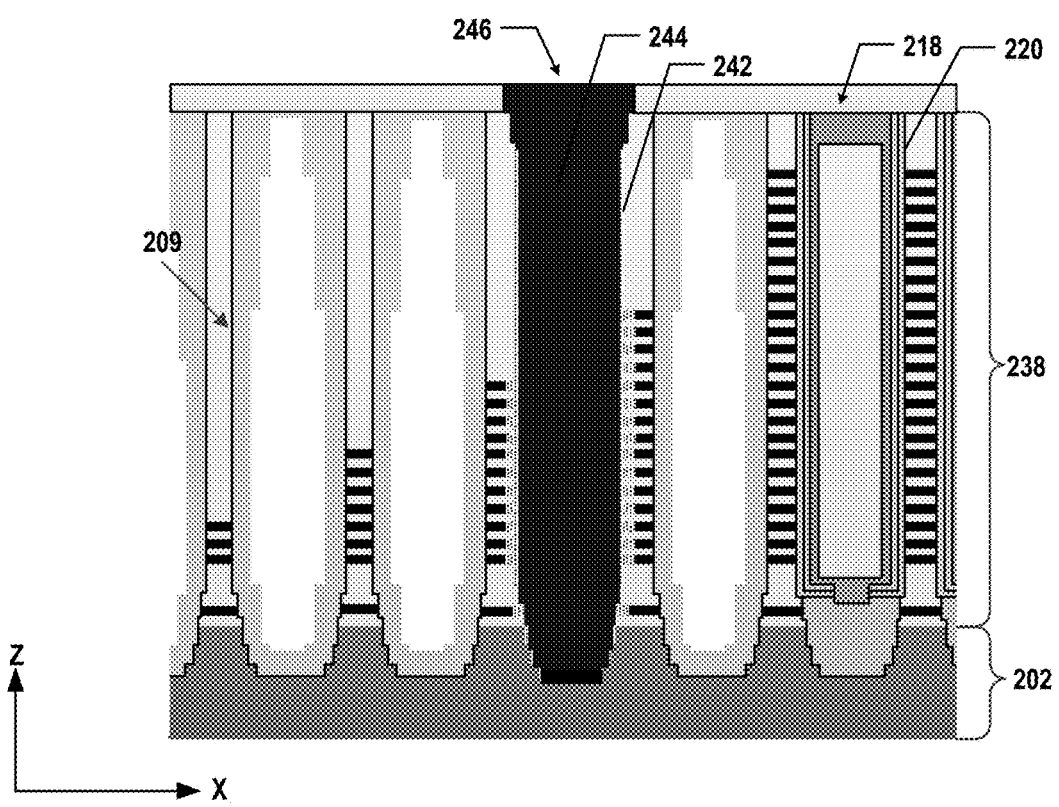

Method 300 proceeds to operation 312, as illustrated in FIG. 3, in which a contact is formed within the spacer in the dummy source hole. In the example of method 400 in FIG. 4, at operation 414, a contact is formed within the spacer in the dummy source hole. The contact may be electrically connected to other peripheral devices. The contact can be deposited over the spacer in each of the dummy source holes. As illustrated in FIG. 2L, a contact 244 is formed within spacer 242 in dummy source hole 212 (shown in FIG. 2K). Contact 244 can be formed by depositing conductive materials including, not limited to, W, Co, Cu, Al, polysilicon, silicides, or any combination thereof, over spacer 242 in the dummy source hole using one or more thin film deposition processes, such as ALD, CVD, PVD, any other suitable processes, or any combination thereof. A dummy source structure 246 including spacer 242 and contact 244 is thereby formed in the dummy source hole, surrounded by a plurality of dummy channel structures 209. In the inner region (e.g., inner region 116 shown in FIG. 1A), source structures may also be formed. Source structures formed in the inner region may be connected with surround channel structures (e.g., channel structure 220 of memory string 218 shown in FIG. 2E) via a common source, such as a doped region (not shown) in substrate 202. In some embodiments, dummy source structure 246 may not connect to channel structures in the inner region. Instead, dummy source structure 246 may be formed simultaneously with source structures in the inner region, while functioning as a mechanical supporting structure after gate-replacement process, without connecting to channel structures in the inner region. In some embodiments, dummy source structure 246 may not reach substrate 202. For example, dummy source structure 246 may be above substrate 202 while still reach the lower part of the dielectric stack to carry out the gate-replacement process.

In some embodiments, contact 244 may be formed simultaneously with word line contacts by filling conductive materials simultaneously to dummy source hole 212 and staircase contact 122 (shown in FIG. 1A). In this way, dummy source structures can be formed in the same processes of forming the word line contacts.

In some embodiments, after the gate-replacement process, dummy source hole 212 may be filled with dielectric materials without conductive materials. For example, when dummy source hole 212 is filled in a separate step from forming word line contact, any suitable materials can be used to form dummy source structure 246, including dielectric materials, conductive materials, or any combination thereof. When conductive materials are used to fill dummy source hole 212 (e.g., contact 244), the dummy source structure 246 may function as an interconnect to connect 3D memory device 100 with other peripheral devices. When dielectric materials are used to fill dummy source hole 212, dummy source structure 246 may function as a mechanical support structure to improve the stability of the staircase region.

In some embodiments, a 3D memory device includes a substrate, a memory stack comprising interleaved conductive layers and dielectric layers on the substrate, a staircase structure on one side of the memory stack, a staircase contact in the staircase structure, and a plurality of dummy source structures each extending vertically through the staircase structure. The plurality of dummy source structures surrounds the staircase contact.

In some embodiments, the plurality of dummy source structures are located adjacent to the staircase contact.

In some embodiments, at least two of the plurality of dummy source structures are of nominally equal lateral distances to the staircase contact.

In some embodiments, the plurality of dummy source structures are of nominally equal lateral distances to the staircase contact.

In some embodiments, in a plan view, at least two of the plurality of dummy source structures are arranged in a first row that extends along a first lateral direction.

In some embodiments, in the plan view, at least two other dummy source structures are arranged in a second row that extends along a second lateral direction perpendicular to the first lateral direction.

In some embodiments, the 3D memory device further includes a plurality of dummy channel structures surrounding the staircase contact, each dummy channel structure extending vertically through the staircase structure.

In some embodiments, the plurality of dummy channel structures are of nominally equal lateral distances to the staircase contact.

In some embodiments, in the plan view, the plurality of dummy source structures interleave with the plurality of dummy channel structures.

In some embodiments, in the plan view, at least two of the plurality of dummy channel structures are arranged in a third row that extends along a third lateral direction in parallel with the first or the second lateral direction.

In some embodiments, the 3D memory device further includes first and second staircase contacts, wherein at least one dummy source structure is located between the first and second staircase contacts.

In some embodiments, at least two dummy source structures are located between the first and second staircase contacts.

In some embodiments, the plurality of dummy source structures are in contact with the substrate.

In some embodiments, the plurality of dummy source structures are not in contact with the substrate.

In some embodiments, a 3D memory device includes a substrate, a memory stack with interleaved conductive layers and dielectric layers on the substrate, a staircase structure on one side of the memory stack, an array of dummy channel structures each extending vertically through the staircase structure, and a plurality of dummy source structures each extending vertically through the staircase stack. A subset of the dummy channel structures is surrounded by the plurality of dummy source structures.

In some embodiments, at least one dummy channel structure is surrounded by at least four dummy source structures.

In some embodiments, at least two dummy channel structure are surrounded by at least six dummy source structures.

In some embodiments, at least four dummy channel structures are surrounded by at least eight dummy source structures.

In some embodiments, in a plan view, two dummy source structures and two dummy channel structures are aligned along a first row extending in a first lateral direction.

In some embodiments, the two dummy source structures are separated by the two dummy channel structure.

In some embodiments, the two dummy source structures are separated by one of the two dummy channel structure.

In some embodiments, in the plan view, two other dummy source structures and two other dummy channel structures are aligned along a second row extending in a second lateral direction perpendicular to the first lateral direction.

In some embodiments, the first and second row cross each other at a dummy channel structure.

In some embodiments, at least one dummy source structure includes a conductor layer in contact with the substrate.

In some embodiments, at least one dummy source structure includes a spacer surrounding the conductor layer along a sidewall of the conductor layer, the spacer including a dielectric material.

In some embodiments, the plurality of dummy source structures are in contact with the substrate.

In some embodiments, the plurality of dummy source structures are not in contact with the substrate.

In some embodiments, a method for forming a 3D memory device includes the following operations. First, a dielectric stack including interleaved sacrificial layers and dielectric layers is formed on a substrate. A staircase structure on at least one side of the dielectric stack is formed. A plurality of dummy channel holes and a plurality of dummy source holes extending vertically through the staircase structure are formed. A subset of the dummy channel holes is surrounded by the plurality of dummy source holes. A dummy channel structure in each of the plurality of dummy channel holes is formed. Interleaved conductive layers and dielectric layers in the staircase structure are formed by replacing, through the dummy source holes, the sacrificial layers in the staircase structure with the conductive layers. A spacer along a sidewall of each of the plurality of dummy source holes is formed to cover the conductive layers in the staircase structure. A contact within the spacer in each of the plurality of dummy source holes is formed.

In some embodiments, forming the plurality of dummy channel holes and the plurality of dummy source holes includes performing a patterning process to simultaneously form the plurality of dummy channel holes and the plurality of dummy source holes through the staircase structure.

In some embodiments, the method also includes forming a plurality of channel holes through the dielectric stack simultaneously with forming the plurality of dummy channel holes and the plurality of dummy source holes through the staircase structure.

In some embodiments, the method further includes forming a sealing layer in each of the dummy source holes. After forming the sealing layer in each of the dummy source holes, a plurality of channel structures are formed. After forming the plurality of channel structures, the sealing layer from each of the dummy source holes is removed.

In some embodiments, replacing, through the dummy source holes, the sacrificial layers in the staircase structure with the conductive layers includes removing the sacrificial layers in the staircase structure through each of the dummy source holes after forming the plurality of channel structures to form a plurality of lateral recesses and depositing a conductive material to fill up the plurality of lateral recesses.

In some embodiments, the method further includes forming a plurality of recesses abutting a sidewall of each of the dummy source holes prior to forming the spacer.

In some embodiments, forming the plurality of recesses includes etching parts of the conductive layers in the staircase structure that abut the sidewall of the dummy source hole.

In some embodiments, a method for forming a 3D memory device includes the following operations. First, interleaved sacrificial layers and dielectric layers are alternatively deposited on a substrate. A staircase structure is formed on at least one side of the interleaved sacrificial layers and dielectric layer. A plurality of dummy channel holes and a plurality of dummy source holes are formed by simultaneously etching through the staircase structure. The plurality of dummy source holes are aligned with a portion of the plurality of dummy channel holes in a row along a lateral direction in a plan view. A sealing layer is deposited in each of the plurality of dummy source holes and each of the plurality of dummy channel holes. The sealing layer is etched away in each of the dummy source holes. The sacrificial layers in the staircase structure is replaced, through the dummy source holes, with a plurality of conductive layers. A spacer is deposited along a sidewall of each of the dummy source holes.

In some embodiments, the method further includes depositing a contact within the spacer in each of the plurality of dummy source holes.

In some embodiments, the method further includes patterning an etching mask on the staircase structure. The etching mask includes a plurality of first openings corresponding to the plurality of dummy channel holes and a plurality of second openings corresponding to the plurality of dummy source holes.

In some embodiments, depositing a sealing layer in each of the plurality of dummy source holes includes performing a rapid-sealing deposition process to deposit a sealing material in the plurality of dummy source holes and the plurality of dummy channel holes.

The foregoing description of the specific embodiments will so reveal the general nature of the present disclosure that others can, by applying knowledge within the skill of the art, readily modify and/or adapt for various applications of such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a substrate;
   a memory stack comprising interleaved conductive layers and dielectric layers on the substrate;
   a staircase structure on one side of the memory stack;
   a staircase contact in the staircase structure; and
   a plurality of dummy source structures each extending vertically through the staircase structure, the plurality of dummy source structures surrounding the staircase contact,
   wherein each of the dummy source structures comprises a conductive contact.

2. The 3D memory device of claim 1, wherein the plurality of dummy source structures are located adjacent to the staircase contact.

3. The 3D memory device of claim 1, wherein at least two of the plurality of dummy source structures are of nominally equal lateral distances to the staircase contact.

4. The 3D memory device of claim 1, wherein the plurality of dummy source structures are of nominally equal lateral distances to the staircase contact.

5. The 3D memory device of claim 1, wherein in a plan view, at least two of the plurality of dummy source structures are arranged in a first row that extends along a first lateral direction.

6. The 3D memory device of claim 5, wherein in the plan view, at least two other dummy source structures are arranged in a second row that extends along a second lateral direction perpendicular to the first lateral direction.

7. The 3D memory device of claim 5, further comprising a plurality of dummy channel structures surrounding the staircase contact, each dummy channel structure extending vertically through the staircase structure.

8. The 3D memory device of claim 7, wherein the plurality of dummy channel structures are of nominally equal lateral distances to the staircase contact.

9. The 3D memory device of claim 7, wherein in the plan view, the plurality of dummy source structures interleave with the plurality of dummy channel structures.

10. The 3D memory device of claim 7, wherein in the plan view, at least two of the plurality of dummy channel structures are arranged in a third row that extends along a third lateral direction in parallel with the first or the second lateral direction.

11. The 3D memory device of claim 1, comprising first and second staircase contacts, wherein at least one dummy source structure is located between the first and second staircase contacts.

12. The 3D memory device of claim 1, wherein at least two dummy source structures are located between the first and second staircase contacts.

13. The 3D memory device of claim 1, wherein the conductive contact comprises a conductor layer, and wherein the at least one dummy source structure further comprises a spacer surrounding the conductor layer along a sidewall of the conductor layer, the spacer comprising a dielectric material.

14. A three-dimensional (3D) memory device, comprising:
   a substrate;
   a memory stack comprising interleaved conductive layers and dielectric layers on the substrate;
   a staircase structure on one side of the memory stack;

an array of dummy channel structures each extending vertically through the staircase structure; and a plurality of dummy source structures each extending vertically through the staircase stack, wherein a subset of the dummy channel structures is surrounded by the plurality of dummy source structures, wherein each of the dummy source structures comprises a conductive contact.

15. The 3D memory device of claim 14, wherein at least one dummy channel structure is surrounded by at least four dummy source structures.

16. The 3D memory device of claim 14, wherein at least two dummy channel structures are surrounded by at least six dummy source structures.

17. The 3D memory device of claim 14, wherein at least four dummy channel structures are surrounded by at least eight dummy source structures.

18. The 3D memory device of claim 14, wherein in a plan view, two dummy source structures and two dummy channel structures are aligned along a first row extending in a first lateral direction.

19. The 3D memory device of claim 18, wherein the two dummy source structures are separated by the two dummy channel structure.

20. The 3D memory device of claim 18, wherein the two dummy source structures are separated by one of the two dummy channel structure.

\* \* \* \* \*